(12) United States Patent
Lemons et al.

(10) Patent No.: US 10,659,855 B2
(45) Date of Patent: May 19, 2020

(54) VOICE ACTIVATED DEVICE WITH INTEGRATED HEATSINK AND SPEAKER

(71) Applicant: Amazon Technologies, Inc., Seattle, WA (US)

(72) Inventors: Joshua Lemons, Santa Cruz, CA (US); Christopher Nicholas Crawford, Sparks, NV (US); Miguel Virgen, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/134,537

(22) Filed: Sep. 18, 2018

(65) Prior Publication Data

US 2019/0394547 A1    Dec. 26, 2019

Related U.S. Application Data

(60) Provisional application No. 62/687,571, filed on Jun. 20, 2018.

(51) Int. Cl.
| | |
|---|---|
| *H04R 9/06* | (2006.01) |
| *H04R 1/02* | (2006.01) |
| *G06F 3/16* | (2006.01) |
| *H04R 1/04* | (2006.01) |
| *F21V 33/00* | (2006.01) |
| *F21V 7/04* | (2006.01) |
| *H05K 7/20* | (2006.01) |
| *F21Y 115/10* | (2016.01) |

(52) U.S. Cl.
CPC .............. *H04R 1/025* (2013.01); *F21V 7/04* (2013.01); *F21V 33/0056* (2013.01); *G06F 3/165* (2013.01); *G06F 3/167* (2013.01); *H04R 1/04* (2013.01); *H05K 7/20436* (2013.01); *F21Y 2115/10* (2016.08)

(58) Field of Classification Search
CPC .. H04R 1/025; H04R 1/04; F21V 7/04; F21V 33/0056; G06F 3/165; G06F 3/167
USPC ..................................................... 381/336, 87
See application file for complete search history.

(56) References Cited

U.S. PATENT DOCUMENTS

| | | | |
|---|---|---|---|
| 2005/0181841 A1* | 8/2005 | Dou .................. | H04M 1/03 455/575.1 |
| 2010/0027286 A1 | 2/2010 | Lin | |
| 2010/0039792 A1* | 2/2010 | Meyers .................. | F21L 2/00 362/20 |

(Continued)

FOREIGN PATENT DOCUMENTS

| | | |
|---|---|---|
| DE | 20 2017 107 61 U1 | 3/2018 |
| FR | 3 007 823 A1 | 1/2015 |

*Primary Examiner* — Ammar T Hamid
(74) *Attorney, Agent, or Firm* — Eversheds Sutherland (US) LLP

(57) ABSTRACT

Systems, methods, and computer-readable media are disclosed for voice activated devices with integrated heatsinks and speakers. In one embodiment, an example device may include a light ring, a first light emitting diode, a heatsink having a first side and a second side, and a speaker assembly coupled to the first side of the heatsink assembly. The heatsink and the speaker assembly together may form a first sealed cavity. The device may include a reflector component coupled to the second side and configured to direct light towards the light ring. The reflector component may optionally include a substantially linear member and a bent member.

20 Claims, 21 Drawing Sheets

(56) References Cited

U.S. PATENT DOCUMENTS

2010/0128496 A1    5/2010  Chang
2017/0198869 A1*  7/2017  Maa ..................... F21V 23/003
2018/0020530 A1*  1/2018  Scordato ............ H05B 37/0236

* cited by examiner

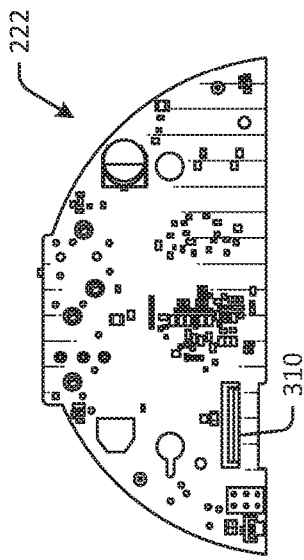
FIG. 8
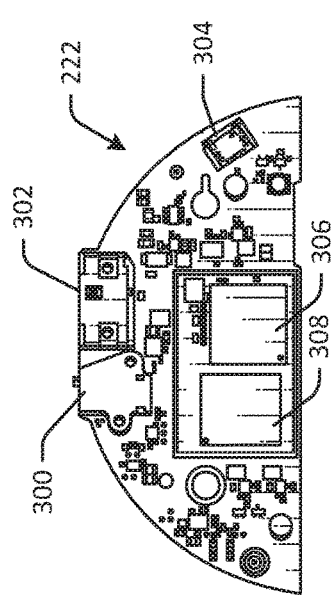
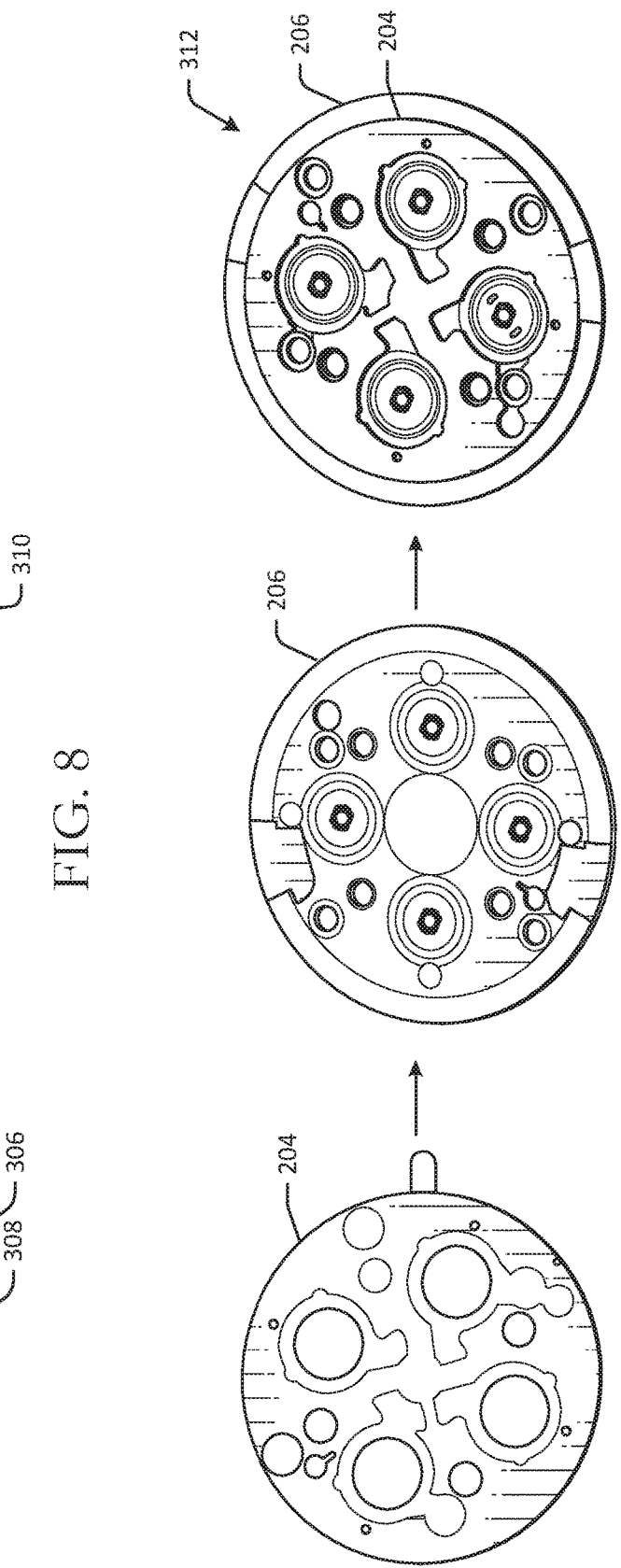
FIG. 9

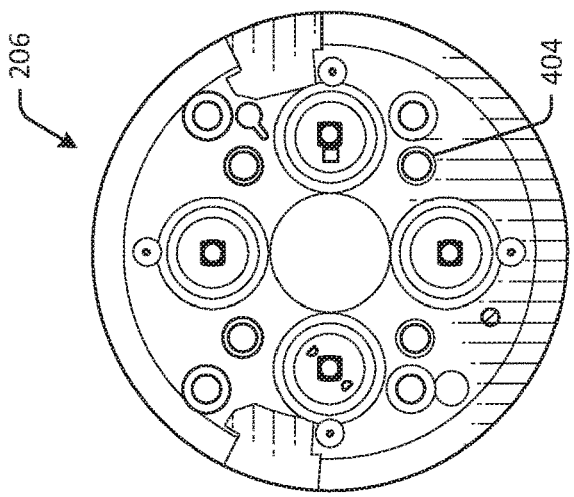
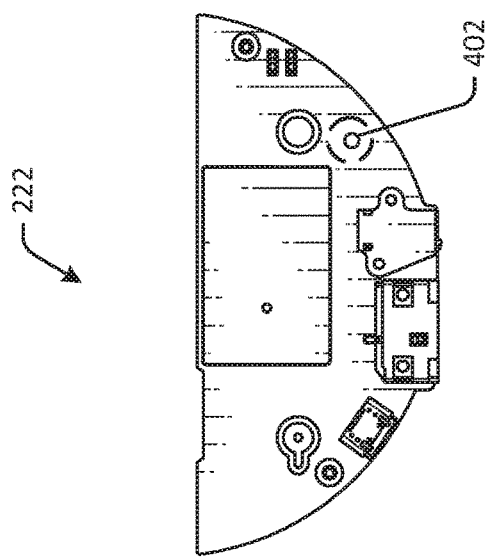
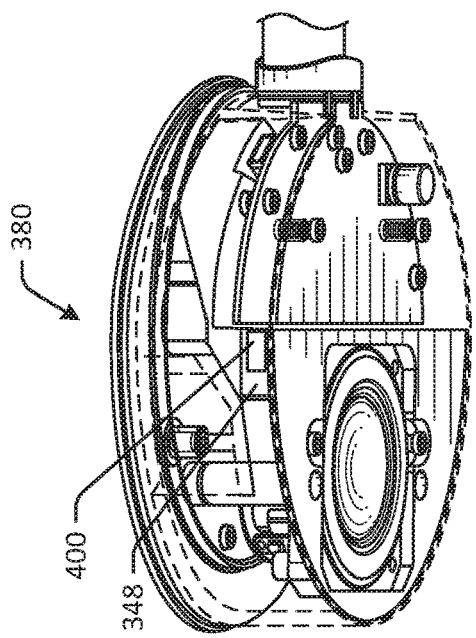
FIG. 21

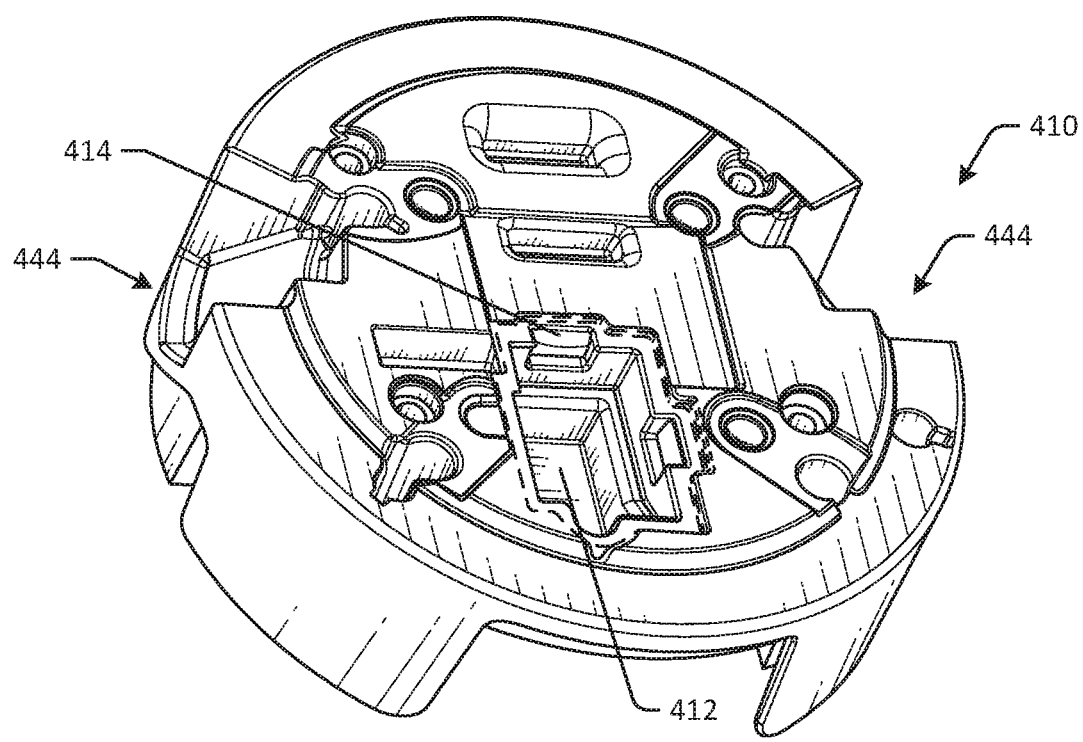
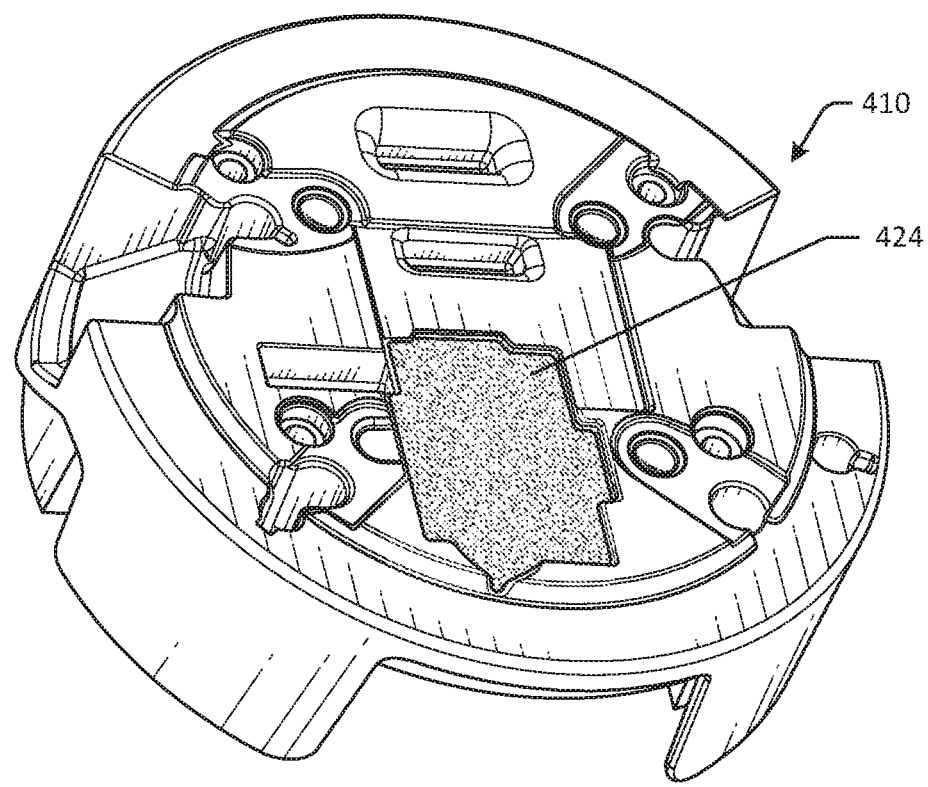
FIG. 25

VOICE ACTIVATED DEVICE WITH INTEGRATED HEATSINK AND SPEAKER

CROSS-REFERENCE TO RELATED APPLICATIONS

This application claims the benefit of U.S. Provisional Application No. 62/687,571, filed Jun. 20, 2018, which is hereby incorporated by reference.

BACKGROUND

Electronic devices may have heatsinks, speakers, and other components. Certain devices may include additional components, such as microphones, lighting, and so forth. However, devices may be bulky and/or have large footprints. Certain devices may be located in areas of limited space. As a result, devices with reduced footprints and/or smaller form factors, while maintaining functionality, may be desired.

BRIEF DESCRIPTION OF THE DRAWINGS

FIG. 8 is a schematic drawing of a logic board component in a top view and a bottom view in accordance with one or more embodiments of the disclosure.

FIG. 9 is a schematic drawing of a microphone board sub-assembly in various stages of assembly in accordance with one or more embodiments of the disclosure.

FIGS. 21-23 are schematic drawings of an integrated heatsink and speaker sub-assembly in various stages of assembly in accordance with one or more embodiments of the disclosure.

FIGS. 24-25 are schematic drawings of an integrated heatsink in various views in accordance with one or more embodiments of the disclosure.

Figure 1:
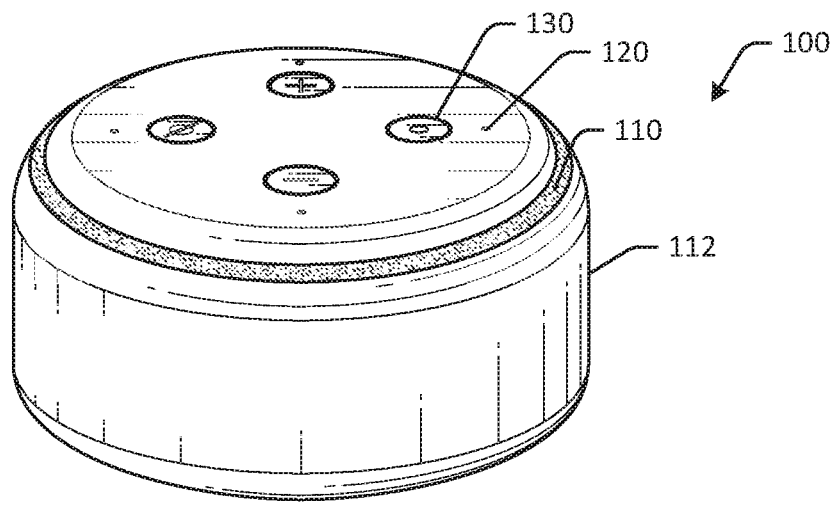
FIGS. 1-3 are schematic drawings of a voice activated device with integrated heatsink and speaker in various views in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may encompass, depending on the context, a plural number of such components or elements and vice versa.

DETAILED DESCRIPTION

Overview

Operation of some voice activated devices may be voice-based and may be voice assistant devices. For example, certain voice activated devices may be controlled by voice-based commands or may otherwise respond to verbal or audible utterances. In another example, voice activated devices may detect sounds in an ambient environment and may determine that a voice activated is being invoked based on, for example, detection of a wakeword or other trigger. A user may say or utter the wakeword to invoke the voice activated. The voice activated device may detect the wakeword and listen for a request or voice command, and may respond accordingly. For example, the voice activated device may cause one or more operations to be performed, such as controlling other devices (e.g., televisions, lights, radios, thermostats, etc.), may respond with audio or visual information (e.g., weather, news, messages, etc.), and/or may perform different actions in response to a request or command. During interaction with a user, certain voice activated devices may provide a visual indicator that is indicative of interaction with one or more users. For example, voice activated devices may include one or more light emitting diodes (LEDs), lighting elements, light bars, displays, and/or other visual indicators that may indicate to a user that the voice activated device is active, listening, not listening, processing, speaking, and/or other actions or states.

In some environments, such as in kitchens, offices, and other areas, space may be limited. Accordingly, devices having reduced or relatively smaller sizes or footprints and/or form factors may be desired. In addition, users may not always be in physical proximity to devices, so visual indicators may need to be visible at certain distances, so as to provide users with visual information without having to be in physical proximity to a device.

Embodiments of the disclosure may include voice activated devices that are configured to operate in various environments, such as environments with limited space, while maintaining audible and/or visual interaction capabilities with users. For example, embodiments of the disclosure may include lighting components, such as circular light rings or other configurations of lighting components, that maintain visibility and/or are visible by users from any number of directions, while maintaining brightness across the entirety of the lighting component. As a result, embodiments of the disclosure may maintain visual indication functionality in various environments.

The techniques, methods, and processes described herein may be used to detect and/or determine voice-based requests or commands, and to initiate actions that may include controlling other electronic devices. For example, certain embodiments may be configured to output signals that control aspects of home entertainment systems, HVAC systems, appliances, and so forth, and may be configured to output audio signals via one or more speakers.

This disclosure relates to, among other things, systems, methods, computer-readable media, techniques, and methodologies for voice activated devices with integrated heat-sinks and speakers. Embodiments may include devices that can be voice-controlled and respond to audible instructions, output audio content, control other electronic devices and/or other operations. Some embodiments include a light ring or other visual indicator that can be used to convey certain information to a user, such as a detected location or direction of sound or a sound source, or a detected location of the user that is currently being listened to by the device, as well as device states, such as a listening state, a processing state, a muted or privacy state, and/or other states. As a result, embodiments of the disclosure may be configured to provide audio and/or visual indicators to users in various environments. Certain embodiments may include light ring features or other components that can be used to convey information to users.

Figure 2:
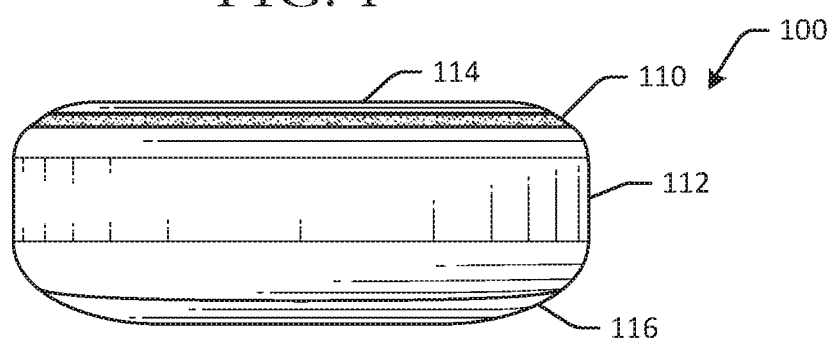
Figure 3:
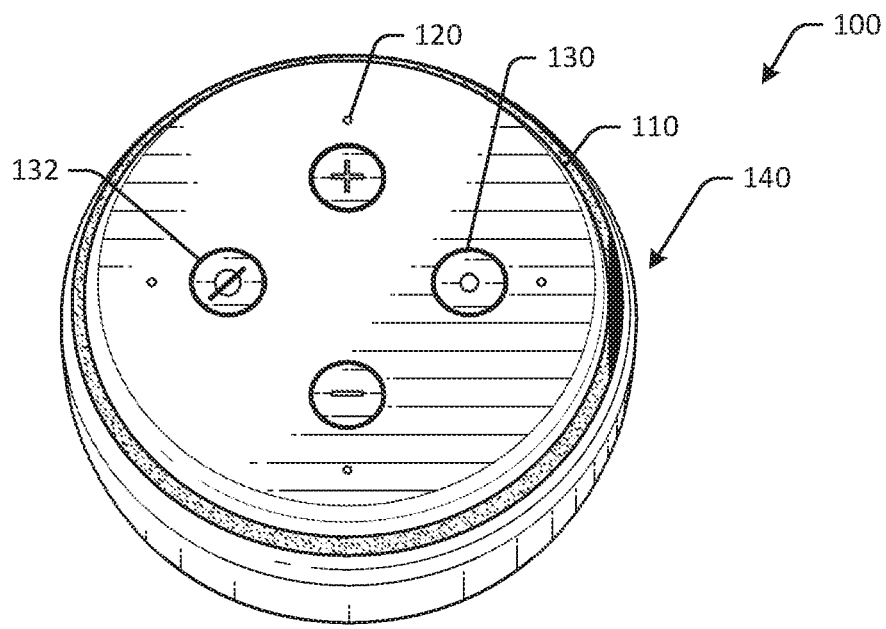

Referring to FIGS. 1-3, an example voice activated device 100 is depicted in accordance with one or more embodiments of the disclosure. FIG. 1 depicts the voice activated device 100 in a top perspective view, FIG. 2 depicts the voice activated device 100 in a side view, and FIG. 3 depicts the voice activated device 100 in a perspective view. The voice activated device 100 may include one or more lighting components, such as a light ring 110. In some embodiments, the light ring 110 may be a circular light ring component that is aligned with a top surface of the voice activated device 100. In other embodiments, the light ring may be angled or may have one or more diagonal portions when viewed, for example, from a side view. The voice activated device 100 may have a housing 112. The housing 112 may be formed of one or more portions. For example, the housing 112 may include a first portion 114 and a second portion 116. The first portion 114 may be a top portion and the second portion 116 may be a bottom portion ("top," "bottom," and "side" are used to describe relative and not absolute positioning). The light ring 110 may be disposed about an outer surface of the voice activated device 100, such as about the first portion 114 of the housing 112, as illustrated in FIGS. 1-3. The housing 112 may include a cylindrical or substantially cylindrical body that forms a sidewall of the voice activated device 100.

The voice activated device 100 may include one or more microphones configured to detect sound and/or generate an audio signal. The microphones may be positioned within the housing 112 and may correspond to the locations of one or more microphone holes 120 on the first portion 114 of the housing 110. In some embodiments, the voice activated device 100 may include a microphone array with a plurality of microphones. The microphone array may include individual microphones arranged or oriented so as to detect sounds from a certain side, such as a "left" side or a right "side" of the voice activated device 100. In the example of FIGS. 1-3, the voice activated device 100 may include four microphones positioned in a circular array arrangement. FIG. 3 illustrates the arrangement of the four microphone holes 120 in the illustrated embodiment. As discussed herein, the voice activated device 100 may also include a speaker to output audio.

The voice activated device 100 may include one or more pressable or physical buttons. For example, the voice activated device 100 may include an action button 130 with a raised protrusion 132 or raised nub that can be used to locate the action button 130 by a user without visualizing the action button 130. The voice activated device 100 may include a privacy button 132 or a mute button that also includes a raised protrusion or other tactile feature that can be used to locate the privacy button 132. Any number of buttons or manually configurable inputs may be included.

The voice activated device 100 may include one or more connection ports that can be used to create one or more wired or wireless connections. For example, the voice activated device 100 may include an auxiliary connection port, an input and/or output port, a charging port, and/or other ports.

The voice activated device 100 may include the light ring 110. The light ring 110 may be a lighting component, such as a circular light ring, that can be used to provide one or more visual indicators. The light ring 110 may be positioned on or near a top side of the voice activated device 100 (e.g., top relative to the bottom and sides in this example). The light ring 110 may output light that is visible by users. As described herein, the light ring 110 may allow light emitted from one or more, or a plurality of, top-firing or side-firing LEDs to be visible by users that are external to the voice activated device 100. For example, in FIG. 3, a user may be speaking an utterance from the right side (as illustrated in the example of FIG. 3) of the voice activated device 100. The voice activated device 100 may detect the utterance and may generate a visual indicator 140 using the one or more LEDs, and may indicate the direction from which the utterance is being detected. The user may therefore be aware that the voice activated device is in a listening state.

Because the LEDs may be spread apart from each other, light may typically appear non-uniform when viewed by a user. For example, light may appear brighter in areas where LEDs are located inside the voice activated device 100. To increase light uniformity, embodiments of the disclosure may include a light reflector component that may direct or guide light emitted by the one or more LEDs, so as to reduce non-uniformity. For example, the light ring 110 may be positioned adjacent to a light reflector disposed within the housing 112. The light reflector may include various features to guide light to locations that may appear dim relative to other locations.

The light ring 110 may form part of an outer surface of the voice activated device 100. In some embodiments, the light ring 110 may form part of the housing 110 of the voice activated device 100. The light ring 110 may be an optically clear or translucent resin of a light or dark color. Light transmission or translucency of the material may be between about 45% and about 60%, such as about 50%. Translucency of the light bar may be based on a thickness of the light ring.

The light ring 110 may be positioned adjacent to the first portion 114 of the housing 112. In some embodiments, the light ring 110 may be positioned between the first portion 114 and the second portion 116 of the housing 110. The light ring 110 may be on a relatively higher half of the voice activated device 100, as illustrated in FIG. 2.

Users may verbally interact with the voice activated device 100 to control the voice activated device 100, as well as to optionally control other electronic devices in the ambient environment. The voice activated device 100 may detect the audible sound from a user and may determine a meaning of the sound. For example, the voice activated device 100 may detect a trigger word or a wakeword of "Alexa," or another trigger word, and may subsequently begin monitoring for voice commands using one or more microphones. In some embodiments, detection and/or processing of voice data or voice commands may be done locally at the voice activated device 100, while in other embodiments the voice activated device 100 may communicate with one or more servers to determine a meaning of a voice command. In some embodiments, the trigger word may be detected and determined locally, while voice commands may be processed remotely. After determining or receiving the meaning of the user utterance, the voice activated device 100 may initiate one or more response actions.

Certain embodiments may include integrated heatsinks and speakers or speaker assemblies, such as metal heatsinks and plastic speaker assemblies, thereby increased a compactness of the voice activated device and reducing a footprint and/or form factor of the voice activated device. As a result, embodiments of the disclosure may be used in environments with limited space, yet may provide visual and audible indications to users that can be heard or seen from various positions.

Example embodiments of the disclosure provide a number of technical features or technical effects. For example, in accordance with example embodiments of the disclosure, certain embodiments of the disclosure may increase a visibility of light visible in lighting elements, control multiple electronic devices and/or vehicle control systems, detect voice commands, determine meanings of voice commands, and/or initiate actions in response to voice commands. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 4:
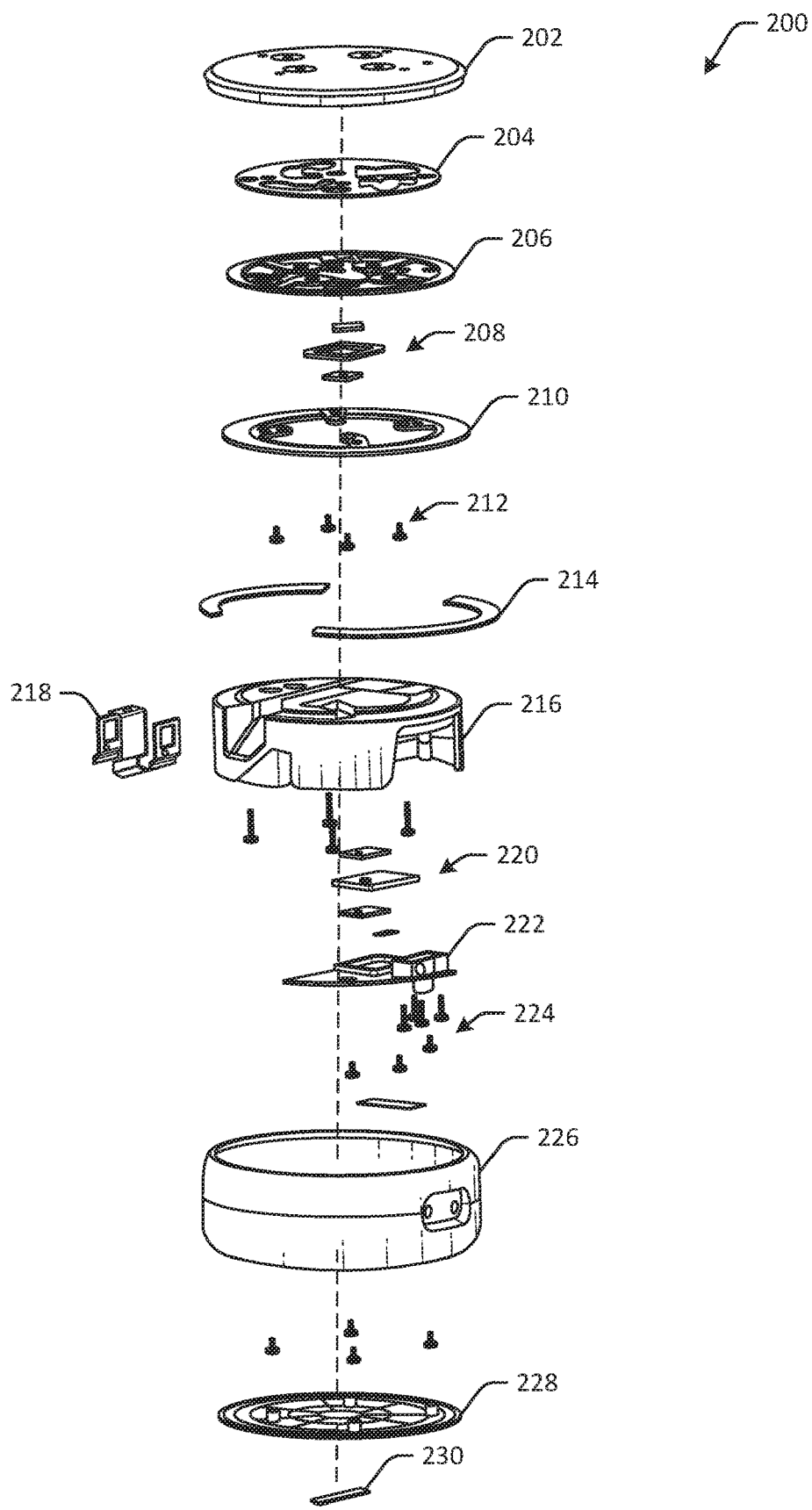
FIG. 4 is a schematic drawing of the voice activated device of FIG. 1 in an exploded view in accordance with one or more embodiments of the disclosure.

FIG. 4 schematically depicts a voice activated device 200 in an exploded view in accordance with one or more embodiments of the disclosure. The voice activated device 200 may be the same or different than the voice activated device 100 of FIG. 1. Other embodiments may include additional or fewer, and/or different, components.

The voice activated device 200 may include a top plate 202. The top plate 202 may at least partially form an upper portion or a top portion of a housing of the voice activated device 200. The top plate 202 may include one or more apertures. For example, one or more apertures may be formed through the top plate 202, so as to allow external access to one or more buttons. A button array may be disposed adjacent to the top plate 202. The button array may include one or more buttons accessible via the apertures in the top plate 202. In the example of FIG. 4, the button array is illustrated coupled to an inside surface of the top plate 202. The top plate 202 may include a light ring component that is coupled to an edge of the top plate. The light ring component may be part of the top plate 202 or may be a separate component that is coupled to the top plate 202. The light ring component may be formed of a translucent material that allows light emitted by one or more LEDs within the voice activated device 200 to be viewable by users external to the voice activated device 200. In some embodiments, the light ring component may be a circular light ring disposed about an upper portion or the top plate 202 of a cylindrical housing of the voice activated device 200.

A foam layer 204 may be disposed adjacent to the top plate 202 and/or the button array. The foam layer 204 may include microphone mesh(es). The foam layer 204 may be disposed adjacent to a microphone board 206. The microphone board 206 may be a printed circuit board assembly and may include one or more microphones disposed on a surface of the microphone board 206. The one or more microphones may be aligned with microphone holes or apertures on the top plate 202. The microphone board 206 may include one or more LEDs. The one or more LEDs may be disposed on a side of the microphone board 206 opposite the microphone(s). The one or more LEDs may be top-firing or side-firing LEDs and may be configured to output light that is visible through the light ring and/or edge portion of the top plate 202.

One or more thermal pads 208 and/or shields, such as WiFi shields may be disposed on the microphone board 206. In one example, the thermal pads 208 and/or the shields may be disposed on a side of the microphone board 206 opposite the microphones. In other embodiments, the thermal pads 208 and/or the shields may be disposed on the same side of the microphone board 206 as the microphones.

A reflector component 210 may be disposed adjacent to the microphone board 206. The reflector component 210 may be a light reflector and may be configured to direct, reflect, or guide light emitted from one or more LEDs. The reflector component 210 may be circular and may include a circular perimeter. The reflector component 210 is illustrated in detail in FIGS. 6-7. The reflector component 210 may be formed of an optically clear resin, such as a white colored resin.

The reflector component 210 and the microphone board 206 may be coupled to the top plate 202 using one or more screws 212. The foam layer 204 may be compressed between the top plate 202 and the microphone board 206. A reflector foam layer 214 may be disposed along a lower surface, or a surface opposite the surface in contact with the microphone board 206, of the reflector component 210. The reflector foam layer 214 may prevent light leakage away from the reflector component 210 and/or may increase reflectiveness.

An integrated heatsink and speaker assembly 216 may be disposed adjacent to the reflector component 210 and/or the reflector foam layer 214. The integrated heatsink and speaker assembly 216 may include a metal heatsink, such as an aluminum heatsink, and a plastic speaker subassembly. The plastic speaker subassembly may be formed of plastic and may be coupled to a speaker. The speaker may be downward facing relative to the top plate 202 (or outward facing relative to the heatsink). The heatsink and speaker may be coupled using, in one example, glue and may form a sealed cavity or volume of air that can be used to facilitate sound output from the speaker. The speaker subassembly may be disposed within the heatsink in some embodiments. In an example, the integrated speaker and heatsink assembly 216 may include an aluminum heatsink, and a speaker subassembly coupled to a first side of the aluminum heatsink. The speaker subassembly may include a speaker plate coupled to an outward-facing (or downward-facing relative to the top plate 202) speaker, and the aluminum heatsink and the speaker subassembly together may form a sealed volume of air. Example embodiments of an integrated heatsink and speaker assembly is illustrated in detail in FIGS. 21-25.

Additional components 220 may be coupled to the integrated heatsink and speaker assembly 216, and may include speaker screws to secure a speaker to the speaker subassembly, one or more thermal pads for thermal isolation of the heatsink, one or more shield lids, such as WiFi shields, electromagnetic insulation foam, and/or other or different components.

A main logic board 222 may be coupled to the speaker subassembly using one or more screws 224. The main logic board 22 may be coupled to the microphone board 206 using a flexible printed circuit assembly 218 disposed about the integrated heatsink and speaker assembly 216. In some embodiments, additional or fewer boards may be used.

The integrated heatsink and speaker assembly 216, as well as the main logic board 222, may be disposed within a bottom housing 226 of the voice activated device 200. The bottom housing 226 may include a cylindrical portion that forms a sidewall of the voice activated device 200, and may optionally include a bottom portion that forms a bottom surface of the housing of the voice activated device 200. In some embodiments, the bottom housing 226 may be single piece, while in other embodiments, the bottom housing 226 may be formed of more than one piece coupled together, such as a cylindrical portion coupled to a bottom portion. The integrated heatsink and speaker assembly may therefore also have a substantially cylindrical form, so as to fit within the bottom housing 226.

A rubber pad 228 and optional label 230 may be disposed on a lower surface of the bottom housing 226 and may provide grip for the voice activated device 200. The optional label 230 may include information regarding an identification of the voice activated device 200.

Figure 5:
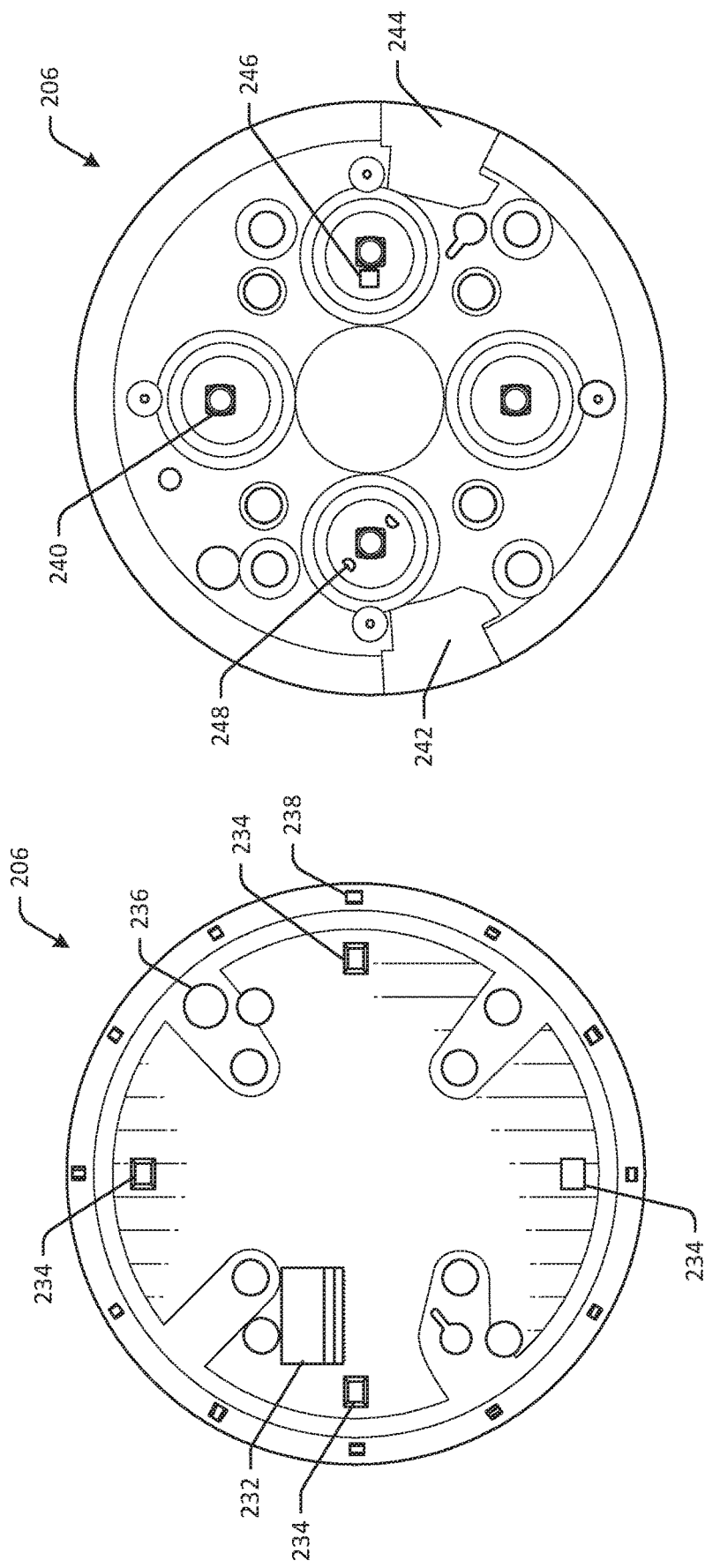
FIG. 5 is a schematic drawing of a microphone board component in a top view and a bottom view in accordance with one or more embodiments of the disclosure.

FIG. 5 is a schematic drawing of a microphone board component in a top view and a bottom view in accordance with one or more embodiments of the disclosure. The microphone board component may be the microphone board 206 of FIG. 2. A bottom side view of the microphone board 206 is illustrated on a left side of FIG. 5, and a top side view of the microphone board 206 is illustrated on a right side of FIG. 5. Other embodiments may include different components and/or different configurations.

As illustrated in FIG. 5, the microphone board 206 may include one or more microphones 234 disposed on the bottom side of the microphone board. The illustrated example includes four microphones 234 disposed in a circular arrangement. Other embodiments may include any number of microphones that are disposed in various arrangements. A flexible printed circuit connector 232 may be disposed on the bottom side of the microphone board 206 and may be configured to receive or otherwise engage the flexible printed circuit connector 218 of FIG. 4. One or more holes 236 may extend through the microphone board 206 and may be used to secure or couple the microphone board to another component of the voice activated device. One or more LEDs 238 may be disposed about a perimeter of the bottom side of the microphone board 206. The LEDs 238 are illustrated in a circular arrangement. Other embodiments may have a different arrangement. The LEDs 238 may be configured to output red, blue, and green colors of light. In some embodiments, twelve LEDs 238 may be included, while in other embodiments, a different number of LEDs 238 may be included. The LEDs 238 may be top-firing or side-firing LEDs. Although described in the context of LEDs, any suitable light output elements may be included.

Referring to the top side of the microphone board 206, one or more tact switches 240 may be disposed on a top surface, or an upper surface, of the microphone board 206. The tact switches 240 may be engaged, in one example, when a user presses a button on the voice activated device. The tact switches 240 may therefore be aligned with buttons on a button array of the voice activated device.

One or more antennas may be disposed on the top side of the microphone board 206. For example, a WiFi antenna 242 may be disposed along a first side of the microphone board 206, and a Bluetooth antenna 244 may be disposed along a second side of the microphone board 206.

An ambient light sensor 246 may be disposed adjacent to one of the tact switches 240 and may be configured to detect a light level of an ambient environment of the voice activated device. One or more LEDs 248 may be disposed about one or more of the tact switches 240. For example, the LEDs 248 may be red LEDs and may be activated when a privacy mode is enabled at the device. The light emitted from the LEDs 248 may be visible through the button disposed about the respective tact switch.

Figure 6:
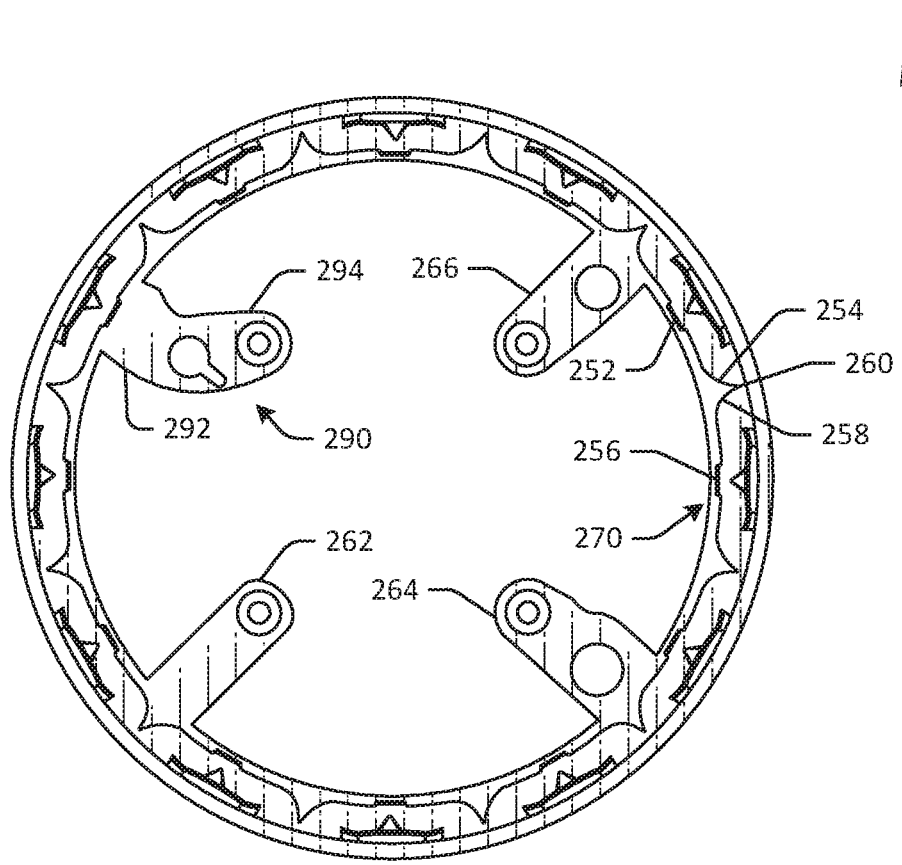
FIGS. 6-7 are schematic drawings of a reflector component in various views in accordance with one or more embodiments of the disclosure.
Figure 7:
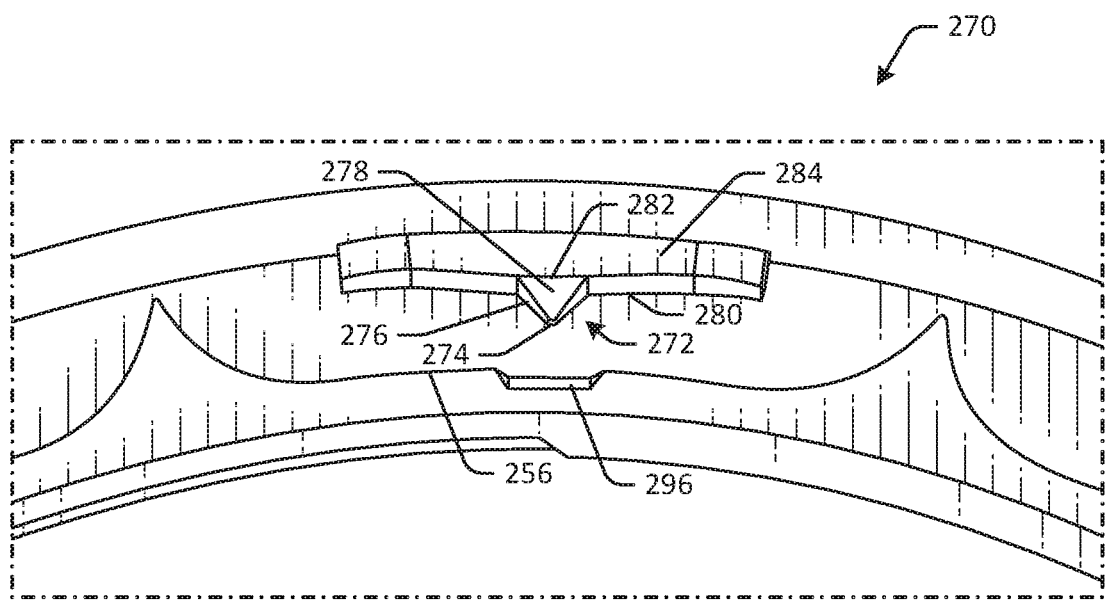

FIGS. 6-7 are schematic drawings of a reflector component in various views in accordance with one or more embodiments of the disclosure. The reflector component may be the reflector component 210 of FIG. 4. A top side view of the reflector component 210 is illustrated in FIG. 6, and a detail view of a portion of the reflector component 210 is illustrated in FIG. 7. The bottom side of the reflector component may be substantially flat. Other embodiments may include different components and/or different configurations.

The reflector component 210 may be, in one embodiment, a circular light reflector and may be configured to reflect light from one or more LEDs, such as the LEDs 238 on the bottom side of the microphone board 206 (illustrated in FIG. 5). The reflector component 210 may be disposed adjacent to an inner portion of the light ring and/or edge portion of the top plate 202 of the voice activated device (illustrated in FIG. 2). The reflector component 210 may be disposed about and/or coupled to a second side of the aluminum heatsink that is opposite a first side of the aluminum heatsink, where a speaker plate is coupled to the first side of the aluminum heatsink.

The reflector component 210 may include one or more, such as a plurality of, linear or substantially linear inward-facing members relative to a perimeter of the reflector component 210. The perimeter may be circular in embodiments where the reflector component 210 is circular. For example, in FIG. 6, the reflector component 210 includes a first substantially linear member 262 that is inward-facing, or that is oriented towards a center of the reflector component 210. The reflector component 210 includes a second substantially linear member 264 that is inward-facing towards the center of the reflector component 210. The reflector component 210 includes a third substantially linear member 266 that is inward-facing towards the center of the reflector component 210. Any number of linear inward-facing or outward facing members may be included.

The reflector component 210 may also include one or more bent members. For example, the reflector component 210 may include a bent member 290. The bent member 290 may include one or more linear portions that together form the bent member 290. For example, the bent member 290 may include a first portion 292 extending from the edge or perimeter portion of the reflector component 210 towards the center, and/or that is oriented towards the center, and a second portion 294 that is oriented away from the center. The second portion 294 may be angled towards the perimeter of the reflector component 210. The substantially linear and/or bent members of the reflector component 210 may be uniformly or non-uniformly spaced about the perimeter of the reflector component. In the example of FIG. 6, the members are illustrated in with uniform spacing.

The reflector component 210 may include one or more features about an outer portion of the reflector component 210. The features may be configured to diffuse and/or direct light emitted from LEDs to certain locations, and may reduce non-uniformity of light visible through the light ring by users. For example, the reflector component 210 may include substantially flat portions of material that are substantially aligned with LEDs (e.g., a midpoint of the substantially flat portion is aligned with a centerline of an LED, etc.). The substantially flat portions may be raised from the surface of the reflector component 210 or may be formed by removing material from the surface of the reflector component 210. The substantially flat portions may curve at a curved portion towards the perimeter of the reflector component 210 gradually as a distance between the LED and the raised portion increases. At or near a midpoint between two adjacent LEDs, the curved portion of a first raised portion for a first LED may merge or converge with the curved portion of a second raised portion for a second LED that is adjacent to the first LED. The merged end may extract light from one or both the first LED and the second LED and direct the light to the merged end, thereby increasing the brightness of what may otherwise be a dim or dull spot (e.g., as the spot may be equidistant from both the first and second LEDs, etc.).

For example, in FIG. 6, a first raised portion may include a substantially flat portion 252 that gradually blends into a first curved portion 254. The first curved portion 254 may curve radially outward, or toward the perimeter of the reflector component 210. A first LED may be disposed on the microphone board adjacent to the substantially flat portion 252. A second raised portion may include a substantially flat portion 256 that gradually blends into a second curved portion 258. A second LED may be disposed on the microphone board adjacent to the substantially flat portion 256. The first curved portion 254 and the second curved portion 258 may merge at an end 260. The end 260 may be disposed approximately midway, and in some instances at a midpoint, between the first LED and the second LED, and may direct light from the LEDs to the end 260. In some embodiments, the first LED may be aligned with a center of the substantially flat portion 252, and the second LED may be aligned with a center of the second substantially flat portion 256. A cutout 296 may be disposed on the raised portion at a surface of the substantially flat portion 256 to accommodate the LED and/or light emitted from the LED, as illustrated in FIG. 7.

The reflector component 210 may include one or more diffuser elements 270. An example of a diffuser element is illustrated in FIG. 7. The diffuser element 270 may include a raised diffuser portion 272. The raised diffuser portion 272 may be aligned with an LED and may be configured to diffuse light emitted by the LED, so as to reduce a bright spot that may be visible through the light ring. The raised diffuser portion 272 may have any suitable geometry, such as triangular, semi-circular, wavy, and/or another suitable geometry.

In the example of FIG. 7, the raised diffuser portion 272 may be a light diffuser element having a triangular inward-facing member. The triangular inward-facing member may have a triangular geometry with a tip 274 of the triangle facing radially inward. The triangular member may have sidewalls 276 with a first height near the tip 274 that is less than a second height near a base 282 of the triangle. The raised diffuser portion 272 may therefore increase in height in a radially outward direction. The raised diffuser portion 272 may have a first height at a radially inward location (e.g., adjacent to the tip 274, etc.) and a second height at a radially outward position (e.g., adjacent to the base 282, etc.), and the first height may be less than the second height.

The raised diffuser portion 272 may include an upper surface 278 that is angled upwards relative to the tip 274. The raised diffuser portion 272 may therefore be a raised triangular portion, where the tip of the triangle is substantially aligned with an LED, in one example.

The raised diffuser portion 272 may include a raised rectangular portion 284 disposed between the base 282 and a perimeter of the reflector component 210. The raised rectangular portion 284 may have a curved outer surface that corresponds to the curvature of the light ring.

FIG. 8 is a schematic drawing of a logic board component in a top view and a bottom view in accordance with one or more embodiments of the disclosure. The logic board component may be the main logic board 222 illustrated in FIG. 4. Other embodiments may include different components and/or different configurations.

The main logic board 222 may include a number of components disposed on a top side, such as flash memory 308, a system-on-a-chip 306, a micro-USB connector port 304, a power adapter receptacle 302, an audio jack 300, and/or other components. Some embodiments may include temperature sensors, speaker contact springs, and/or other components. The main logic board 222 may include a flexible printed circuit connector 310 on a bottom side, as well as a temperature sensor connector and/or other components.

FIG. 9 is a schematic drawing of a microphone board sub-assembly in various stages of assembly in accordance with one or more embodiments of the disclosure. Other embodiments may include different sub-assemblies and/or different configurations.

To assemble the voice activated device, an example process is illustrated in FIGS. 9-18. In FIG. 9, a microphone board module may be assembled. The foam layer 204 may be placed or disposed on the microphone board 206. In some embodiments, the foam layer 204 may be disposed on the top side of the microphone board 206. The combined microphone board and foam may form a microphone board module 312.

Figure 10:
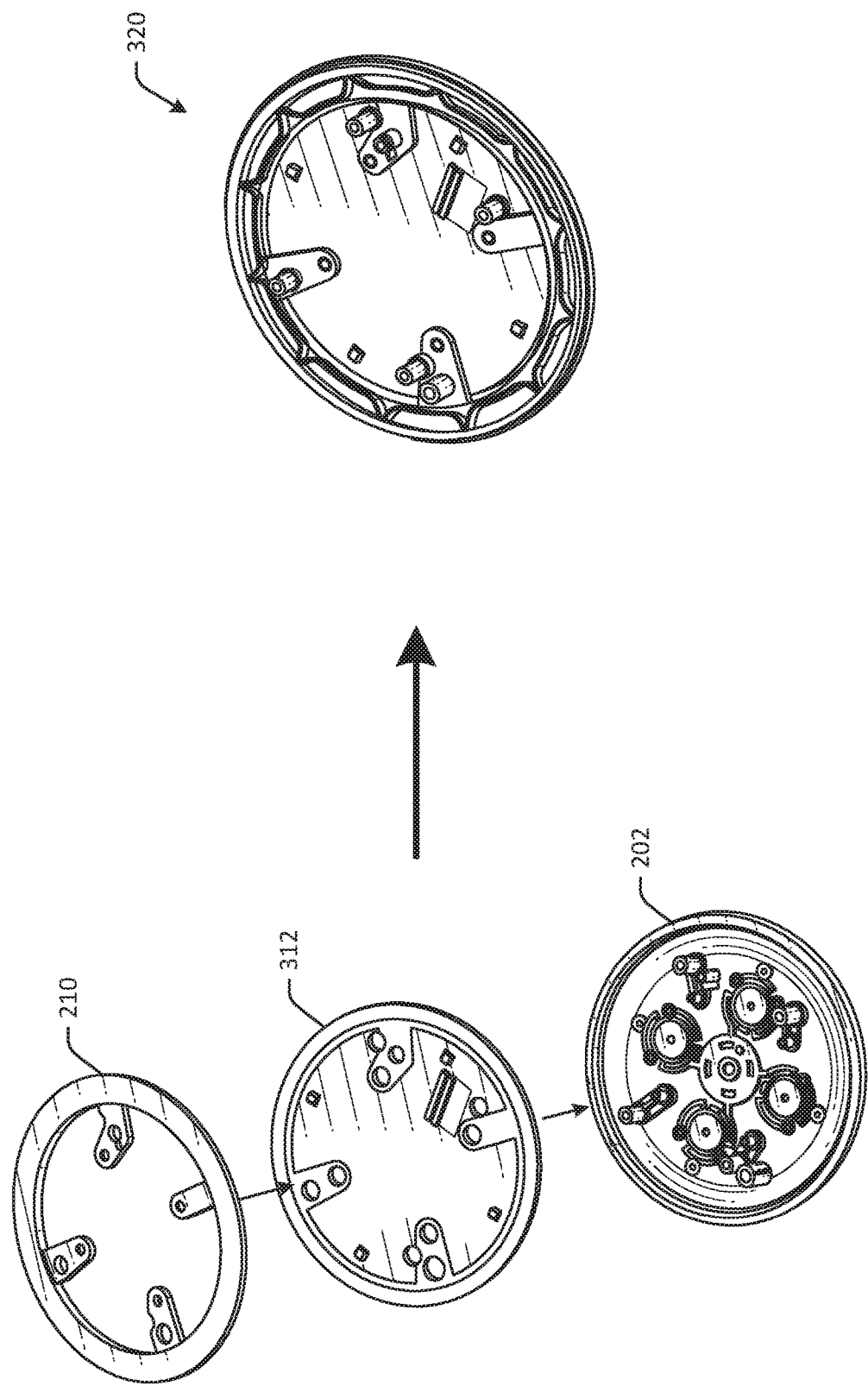
FIG. 10 is a schematic drawing of a top plate sub-assembly in various stages of assembly in accordance with one or more embodiments of the disclosure.
Figure 12:
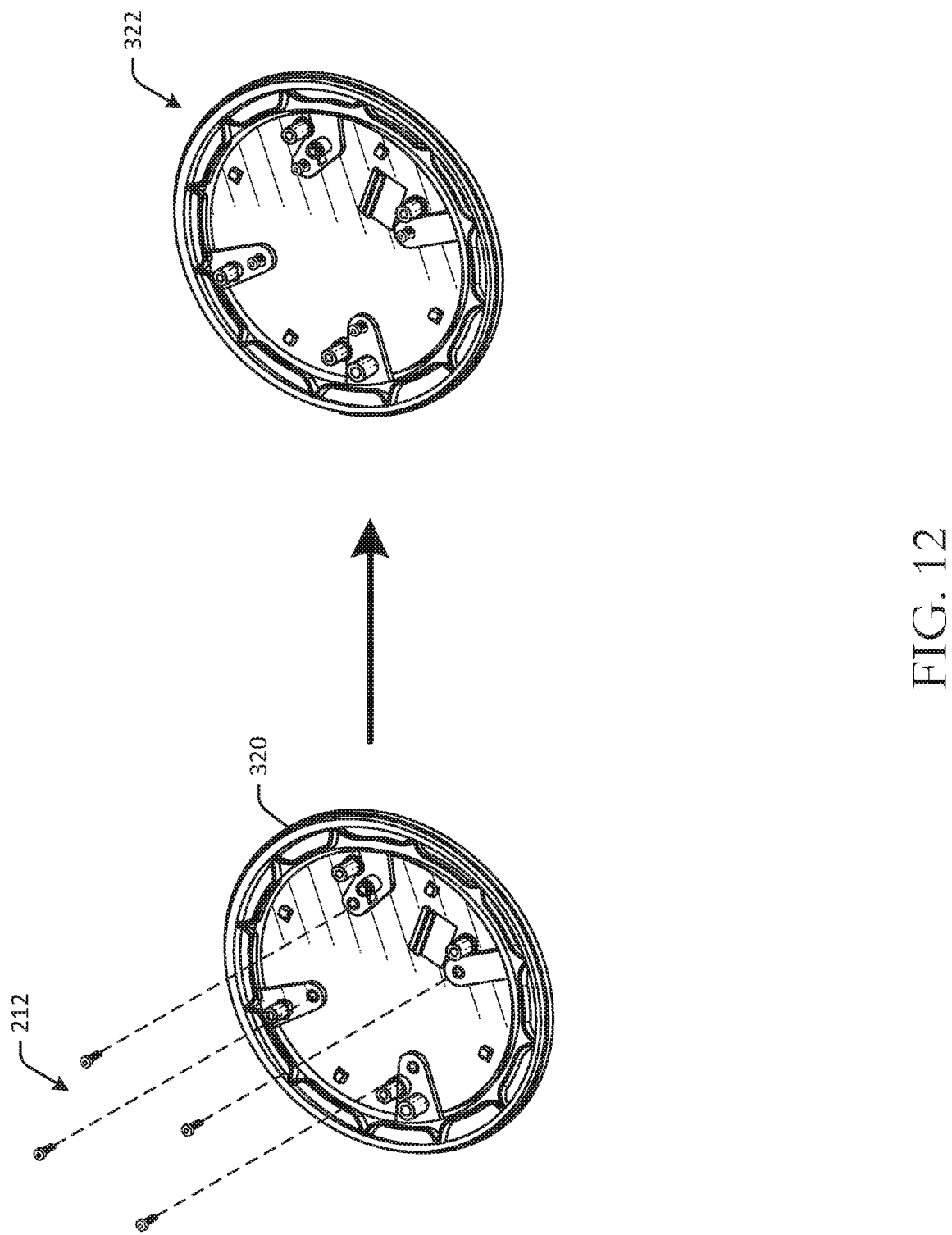

FIG. 10 is a schematic drawing of a top plate sub-assembly in various stages of assembly in accordance with one or more embodiments of the disclosure. To assemble a top plate module, the reflector component 210 may be disposed adjacent to the microphone board module 312, and the reflector component 210 and the microphone board module 312 may be coupled to the top plate 202. In some embodiments, the microphone board module 312 may be placed on the top plate 202 before the reflector component 210 is added to the top plate module 320. As illustrated in FIG. 12, the top plate module 320 may be secured using screws 212. The screws 212 may couple the reflector component 210 and the microphone board module 312 to the top plate 202. Once coupled, a secured top plate module 322 may be formed.

Figure 11:
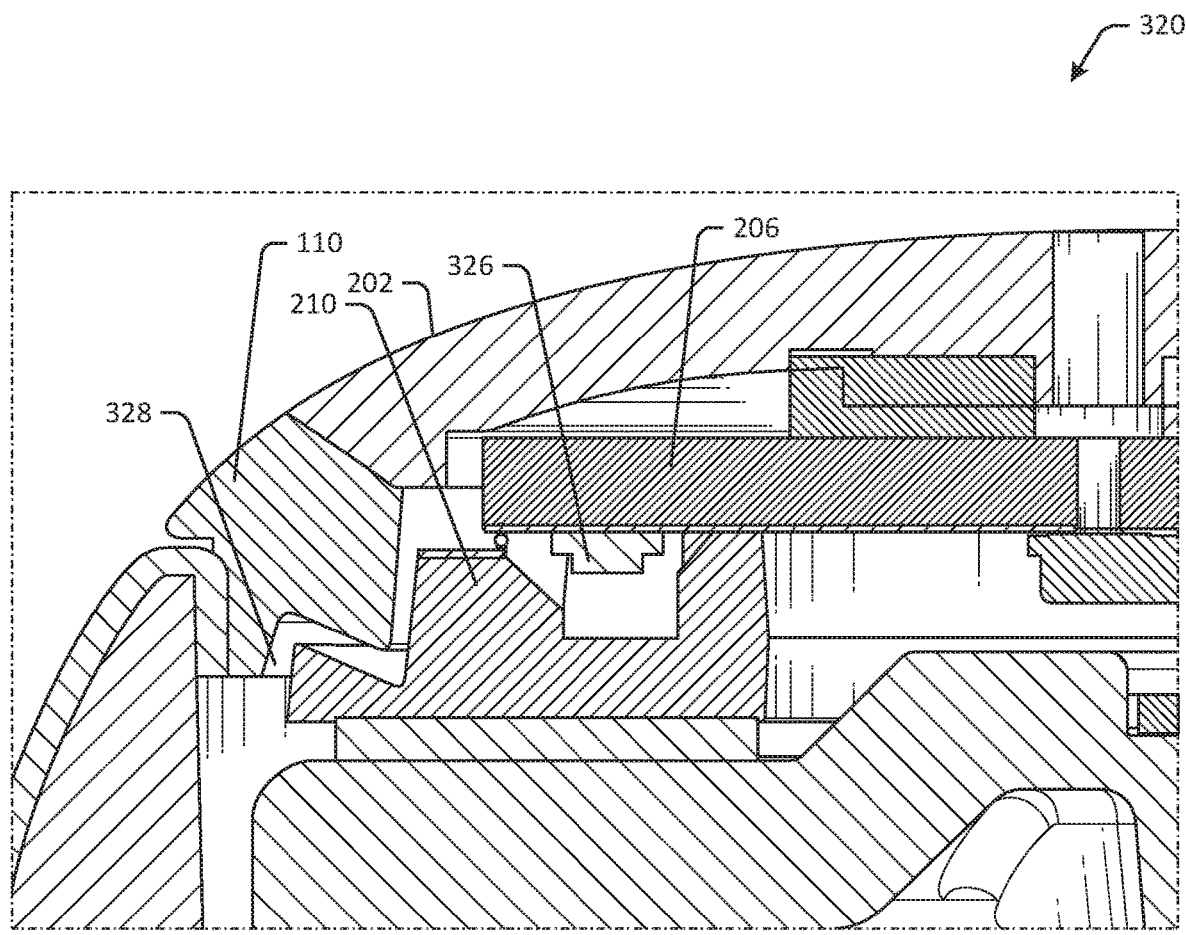
FIGS. 11-12 are schematic drawing of portions of a voice activated device with integrated heatsink and speaker in cross sectional view in accordance with one or more embodiments of the disclosure.

FIG. 11 is a schematic drawing of a portion of a voice activated device with integrated heatsink and speaker in cross sectional view in accordance with one or more embodiments of the disclosure. FIG. 11 illustrates a portion of the top plate module 320 in cross-sectional view. As illustrated, an LED 326 may be disposed on a lower surface of the microphone board 206. The LED 326 may be disposed adjacent to the reflector component 210. An air gap may exist between the LED 326 and the reflector component 210. Light emitted from the LED 326 may be reflected by the reflector component 210 through the light ring 110, which may be adjacent to the top plate 202. As a result, light emitted by the LED 326 may be visible as uniform and without bright spots or hot spots, and may be visible in any number of ambient environment conditions. A gap 328 may be present between the reflector component 210 and the light ring 110. The gap 328 may be about 0.4 millimeter in one example.

Figure 13:
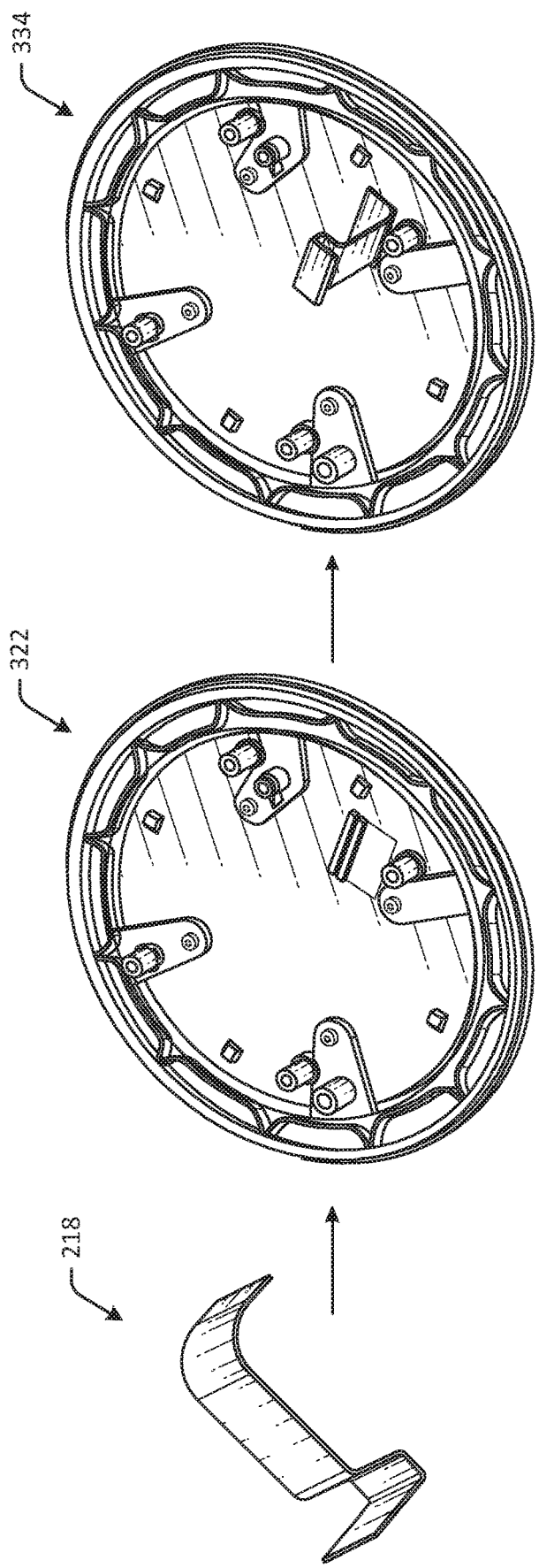
FIG. 13 is a schematic drawing of a top plate sub-assembly with connector in various stages of assembly in accordance with one or more embodiments of the disclosure.

FIG. 13 is a schematic drawing of a top plate sub-assembly with connector in various stages of assembly in accordance with one or more embodiments of the disclosure. FIG. 13 illustrates an assembly process for connecting the flexible printed circuit 218 of FIG. 4 to the top plate module 322 of FIG. 12 to form a connected module 334. Specifically, the flexible printed circuit 2181 may be connected to the microphone board 206 of the top plate module 322. The combined elements may form the connected module 334.

Figure 14:
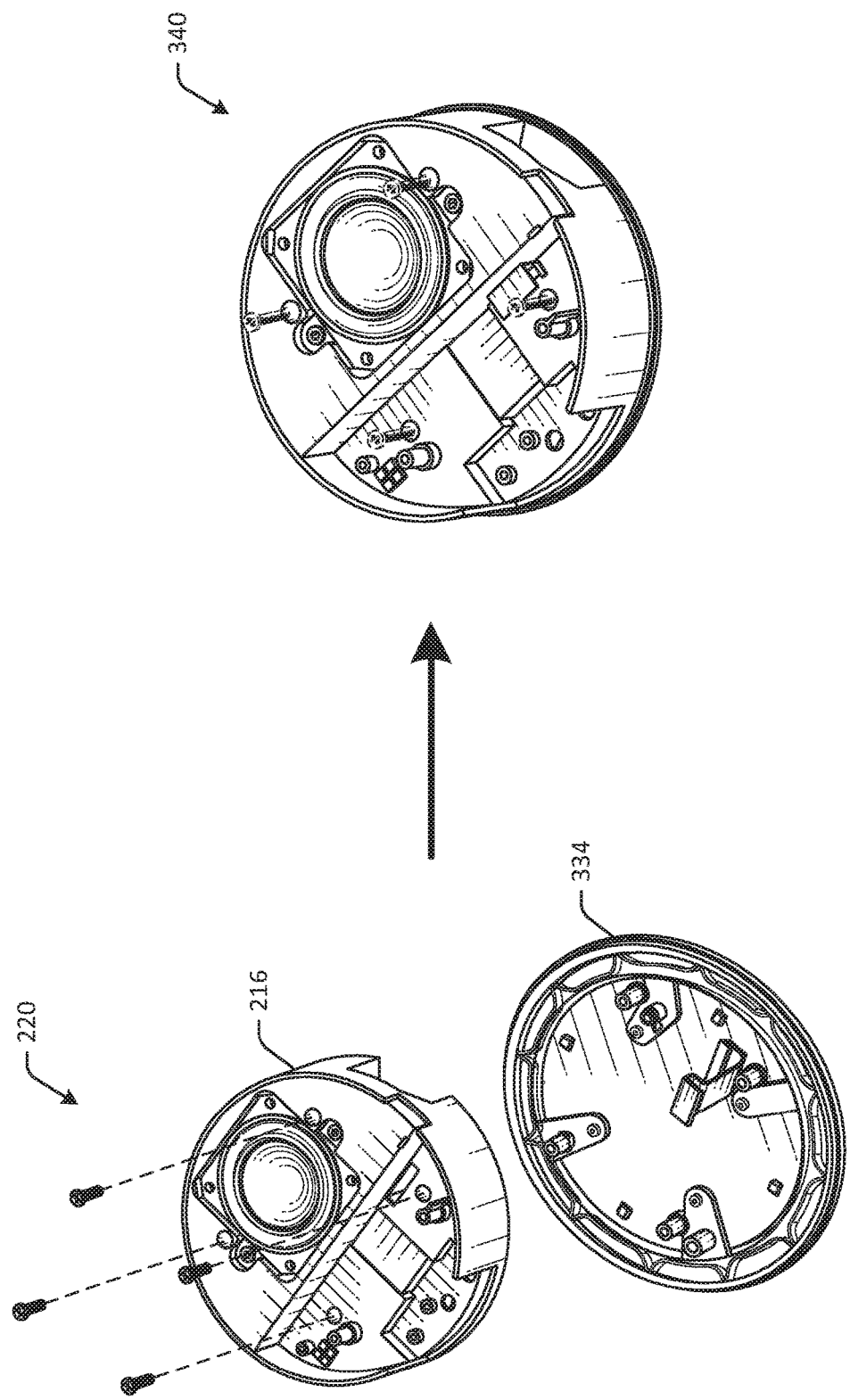
FIG. 14 is a schematic drawing of a speaker module sub-assembly in various stages of assembly in accordance with one or more embodiments of the disclosure.

FIG. 14 is a schematic drawing of a speaker module sub-assembly in various stages of assembly in accordance with one or more embodiments of the disclosure. FIG. 14 illustrates an assembly process for an integrated heatsink and speaker. The heatsink 216 of FIG. 2 may be secured or coupled to the connected module 334 using one or more screws 220. The flexible printed circuit 218 may be routed from the microphone board 206 to an opening in the speaker plate for coupling to the main logic board. The combined assembly may form a top plate and heatsink assembly 340.

Figure 15:
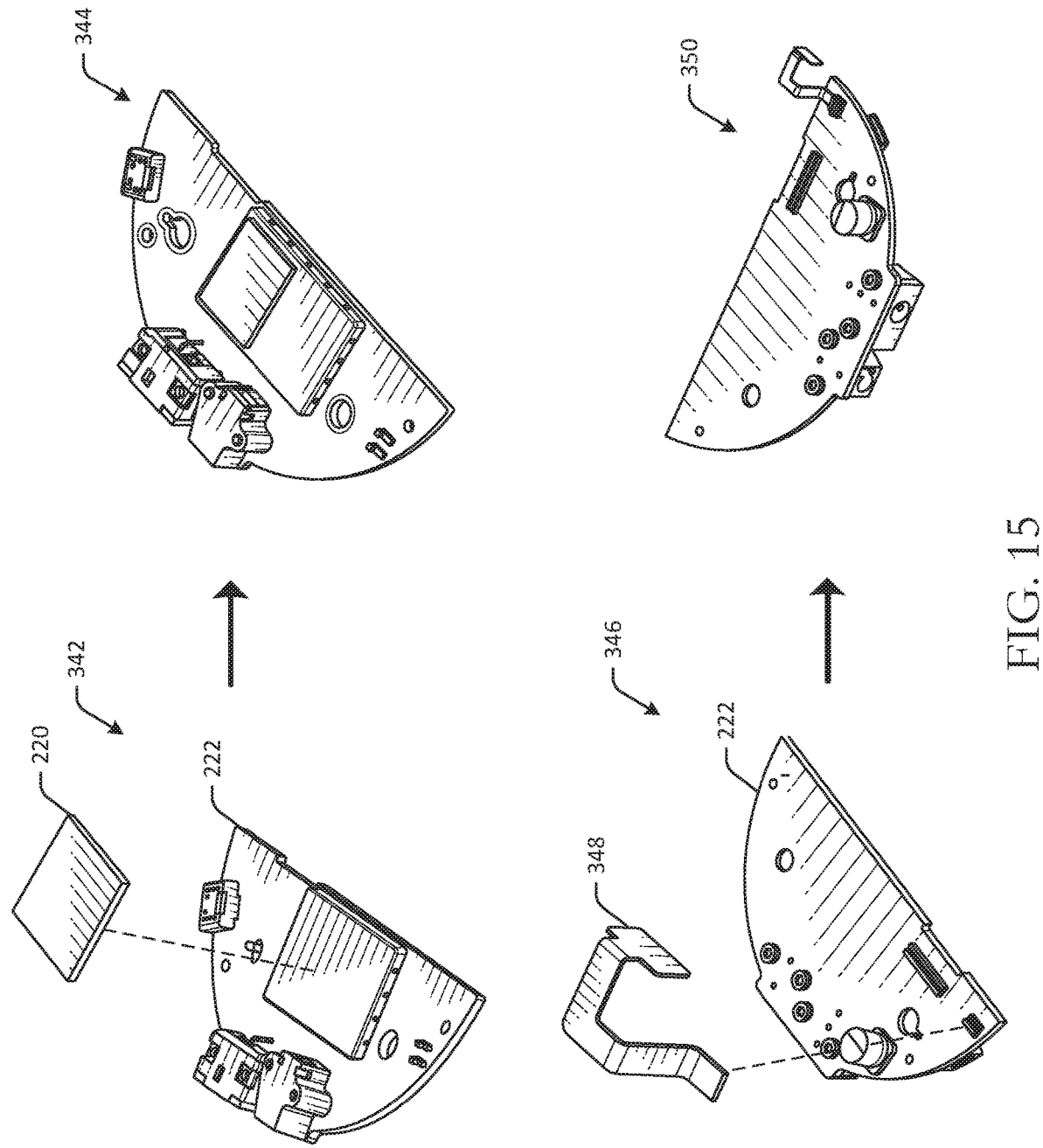
FIG. 15 is a schematic drawing of a main logic board sub-assembly in various stages of assembly in accordance with one or more embodiments of the disclosure.

FIG. 15 is a schematic drawing of a main logic board sub-assembly in various stages of assembly in accordance with one or more embodiments of the disclosure. In FIG. 15, an example process of assembly a main logic board module 350 is illustrated. To assemble the main logic board module 350, at a first step 342, the thermal pad 220 may be placed on the shield can lid of the main logic board 222, so as to form a main logic board subassembly 344. At a second step 346, an optional temperature sensor flexible printed circuit 348 is coupled to the main logic board 222 to form the main logic board module 350.

Figure 16:
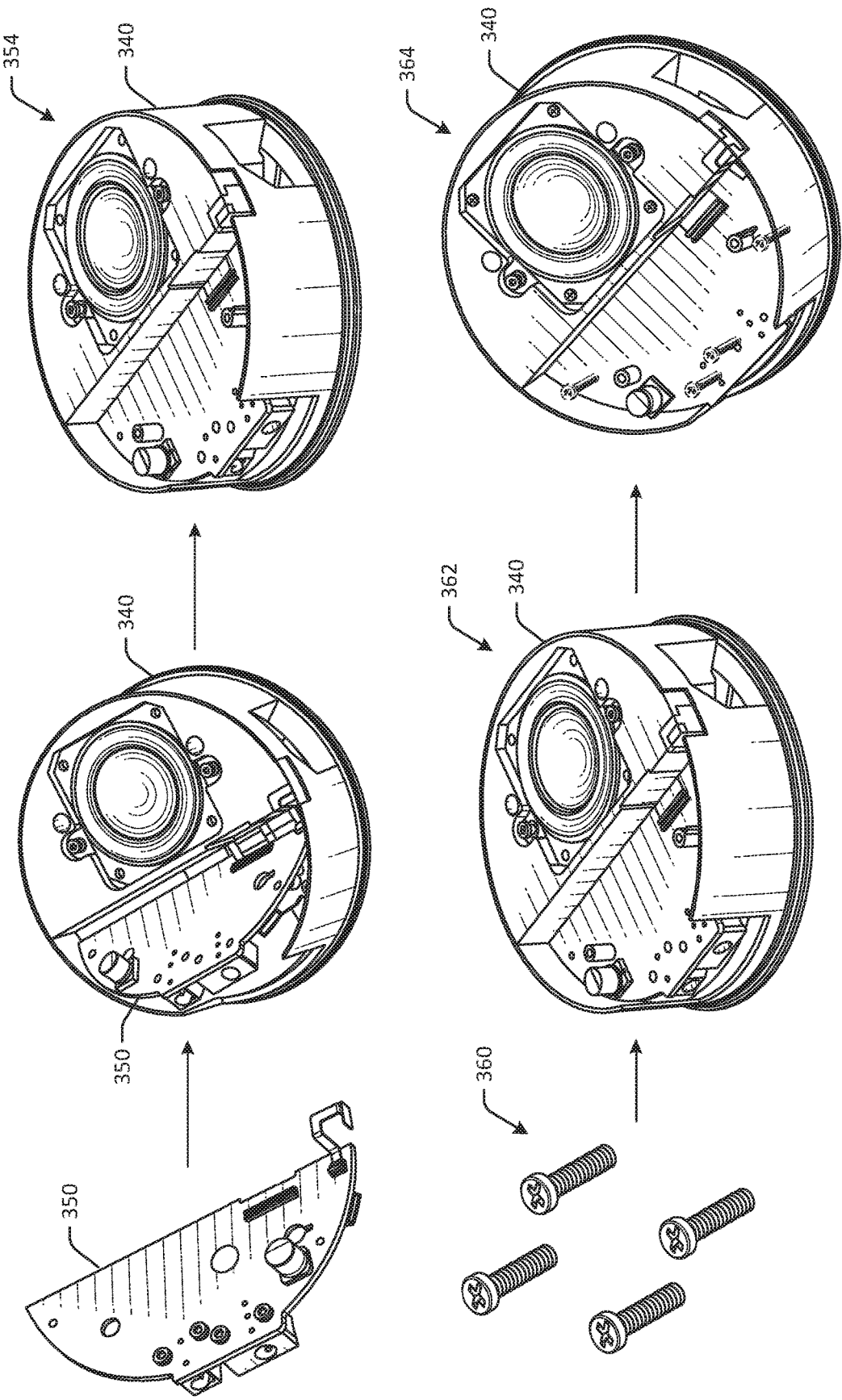
FIG. 16 is a schematic drawing of an integrated speaker sub-assembly in various stages of assembly in accordance with one or more embodiments of the disclosure.

FIG. 16 is a schematic drawing of an integrated speaker sub-assembly in various stages of assembly in accordance with one or more embodiments of the disclosure. FIG. 16 illustrates an example process of assembling the main logic board module 350 and the top plate and heatsink assembly 340. The main logic board module 350 may be tilted and inserted adjacent to the speaker plate in the top plate and heatsink assembly 340. Once inserted, the main logic board module 350 may be aligned and/or leveled. The flexible printed circuit 218 may be connected to the main logic board 222 prior to completing the assembly. One or more screws 360 may be used to couple the main logic board module 350 to the top plate and heatsink assembly 340 to form a stack module 364. In some embodiments, an intermediate step 362 may include pasting an end of the optional temperature sensor flexible printed circuit 348 to the stack module 364 with an adhesive.

Figure 17:
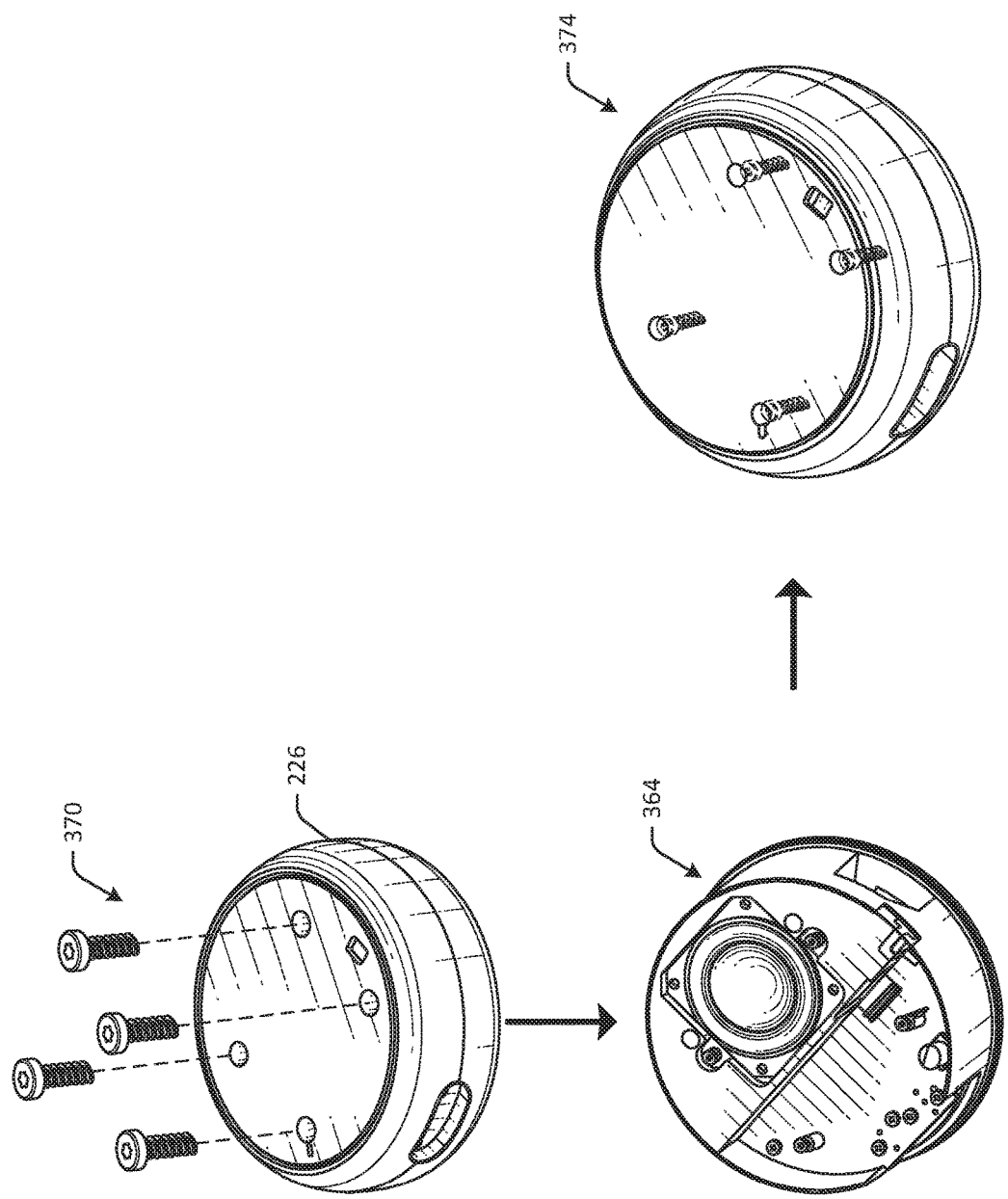
FIGS. 17-18 are schematic drawings of a housing sub-assembly in various stages of assembly in accordance with one or more embodiments of the disclosure.
Figure 18:
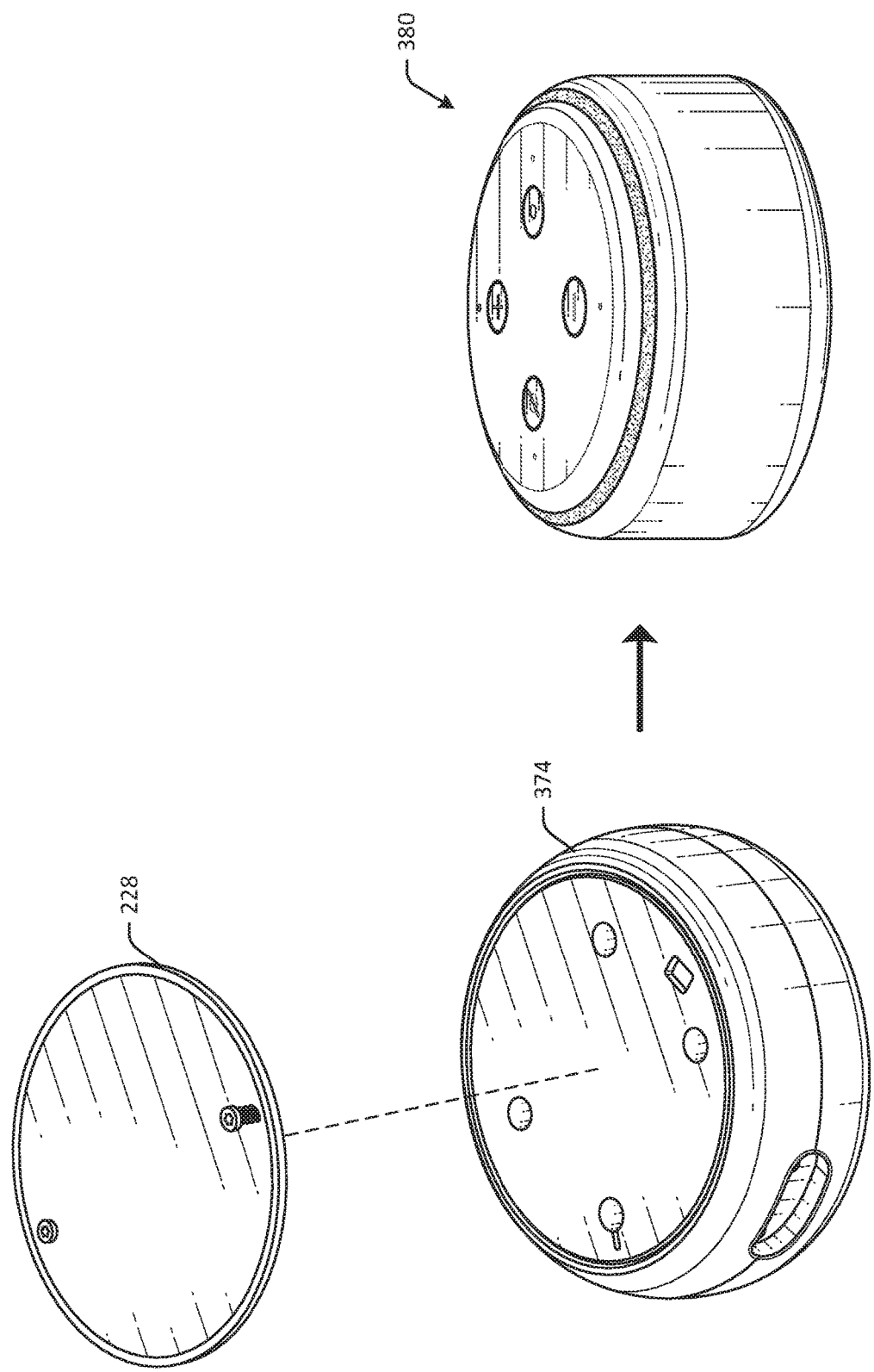

FIGS. 17-18 are schematic drawings of a housing sub-assembly in various stages of assembly in accordance with one or more embodiments of the disclosure. FIG. 17 illustrates an example process of assembly a bottom housing module 374. The bottom housing (e.g., bottom housing 226 of FIG. 2, etc.) may be located onto the stack module 364. The stack module 364 may fit into the cylindrical portion of the bottom housing 226 in such embodiments that have cylindrical housings. The stack module 364 and the bottom housing 226 may be coupled using one or more screws 370, thereby forming the bottom housing module 374.

FIG. 18 illustrates an example process of coupling the rubber pad 228 to the bottom housing module 374. The rubber pad 228 may be coupled to the bottom housing module 374 using, in one example, a pressure sensitive adhesive. Once coupled, a voice activated device 380 may be formed. The voice activated device 380 may be the voice activated device 200 of FIG. 4.

The light ring (e.g., light ring 110 of FIG. 1) of the voice activated device 380 may be configured to indicate a location of sound detected by the voice activated device 380. For example, if a microphone of the voice activated device 380 detects sound or voice coming from a left side of the voice activated device 380, one or more LEDs on the left side of the voice activated device 380 may be caused to illuminate, so as to indicate to a user that sound is being detected from the left side of the voice activated device 380. The light ring may dynamically modify LEDs that are illuminated while sound or voice is detected, and may also be used to visually communicate information to a user. For example, during processing, the light ring may have a certain illumination status, while the device is muted, the light ring may have a different illumination status, and so forth. The light ring may be a circular or substantially circular light bar component and may be visible to users. In some embodiments, the light ring may be positioned elsewhere, along different edges or surfaces, and can be positioned diagonally or in another orientation respective to the housing of the device.

Figure 19:
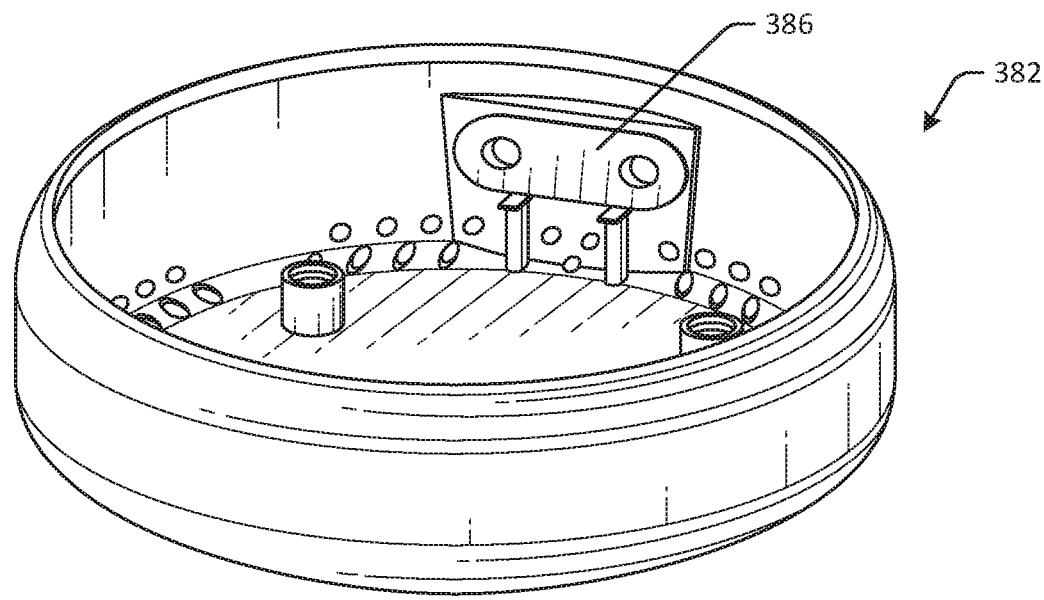
FIGS. 19-20 are schematic drawings of a thermal model of a voice activated device with integrated heatsink and speaker in various stages of assembly in accordance with one or more embodiments of the disclosure.
Figure 20:
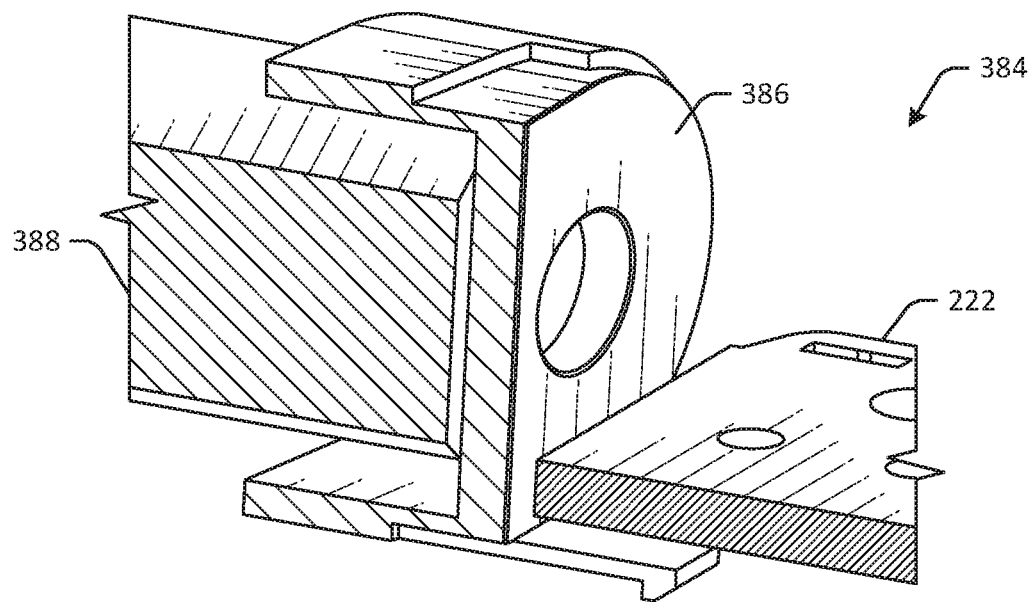

FIGS. 19-20 are schematic drawings of a thermal model of a voice activated device with integrated heatsink and speaker in various stages of assembly in accordance with one or more embodiments of the disclosure. As illustrated in an interior view 382 and detail view 384, copper tape 386 may be added to the connector area and may have a thickness of about 0.1 millimeter. A power cord 388 may engage a surface opposite the copper tape 386.

Figure 22:
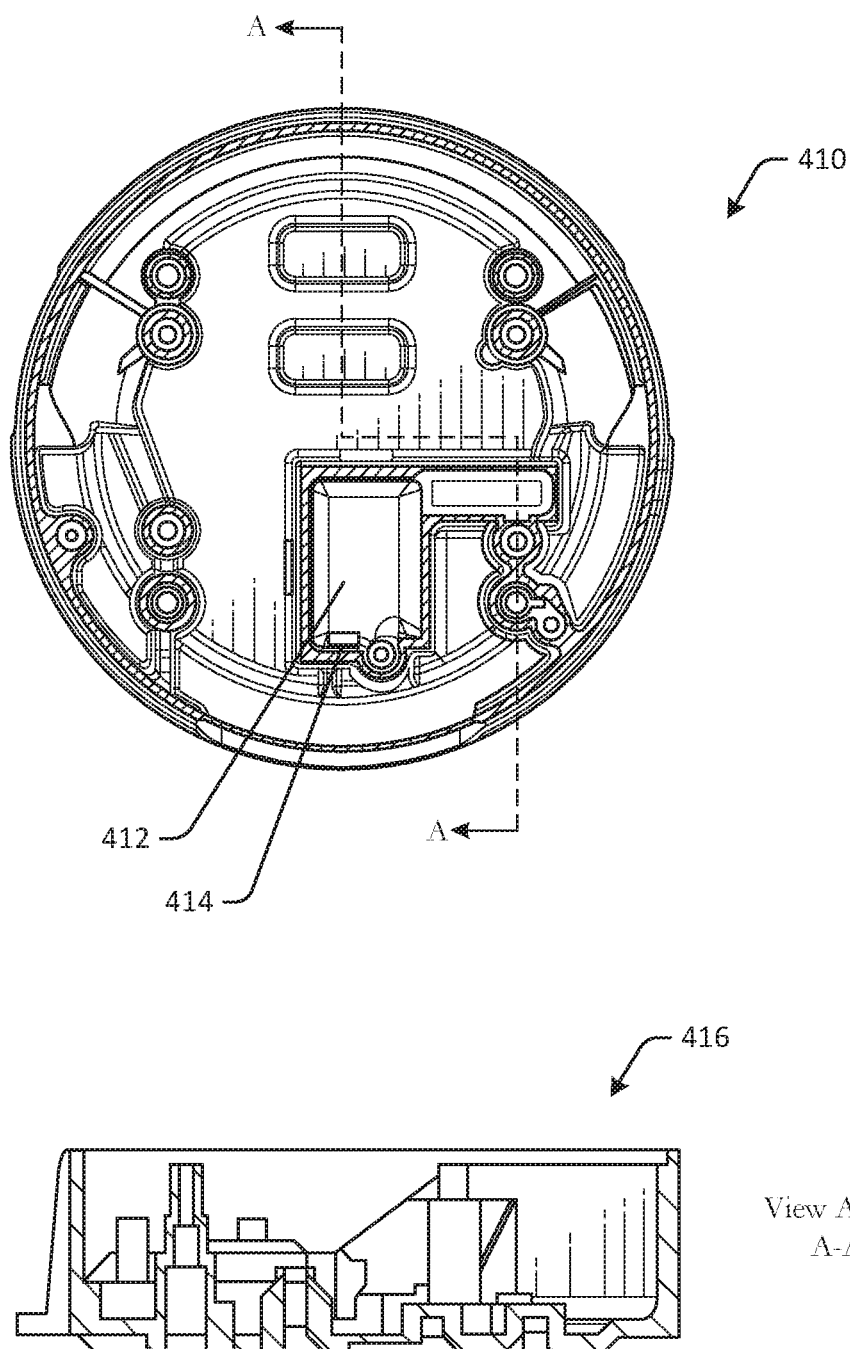
Figure 23:
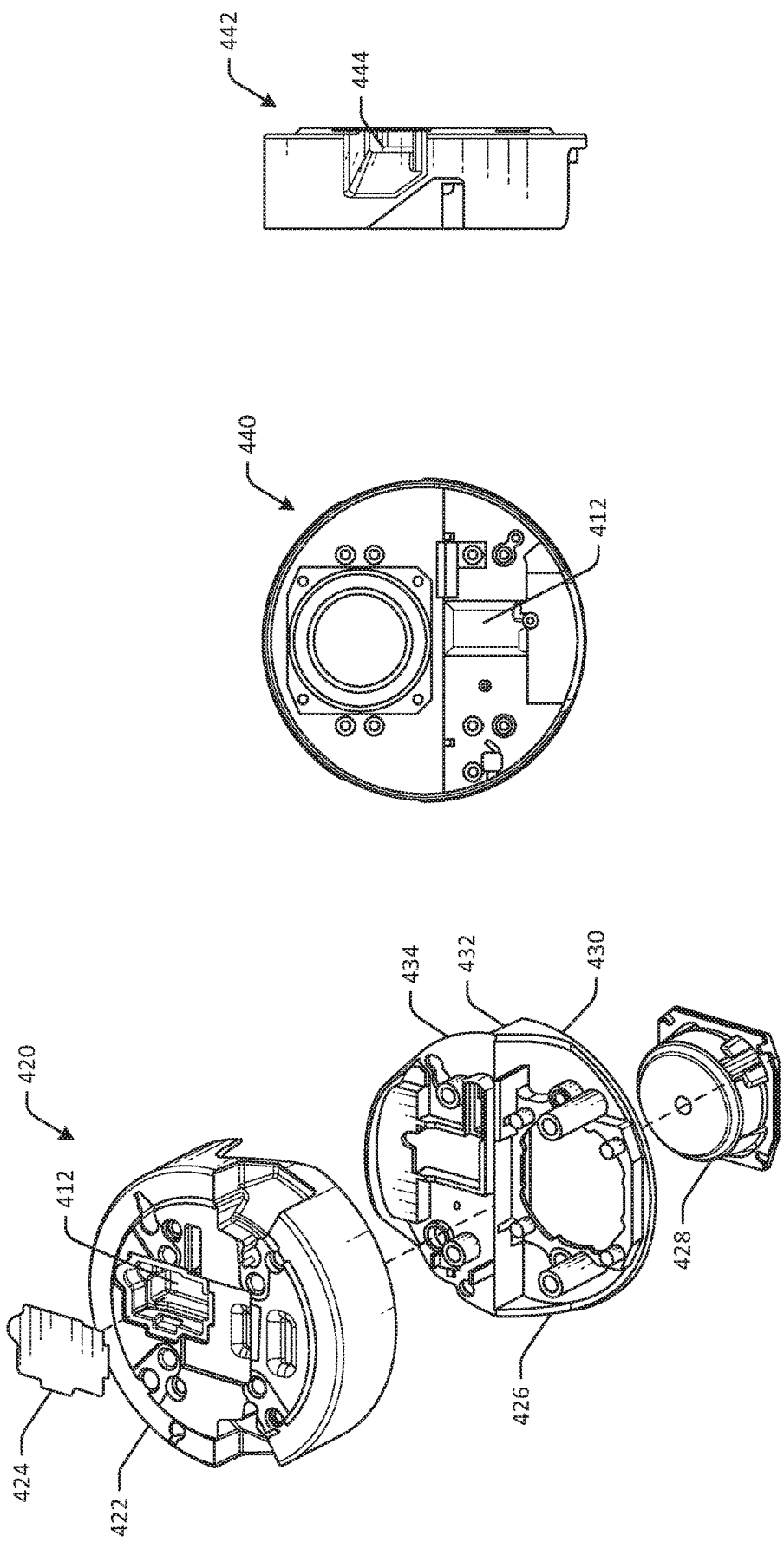

FIGS. 21-23 are schematic drawings of an integrated heatsink and speaker sub-assembly in various stages of assembly in accordance with one or more embodiments of the disclosure. Other embodiments may include different sub-assemblies and/or different configurations. The heatsink may be the heatsink 216 of FIG. 2. Other embodiments may include different components and/or different configurations.

FIG. 21 illustrates an ambient temperature sensor location in an embodiment. A first sensor 400 may be located on the flexible printed circuit 348. A second sensor 402 may be located on the top side of the main logic board 222. A third sensor 404 may be located on the top side of the microphone board 206.

FIG. 22 illustrates an example heatsink 410 in a top view and in a detailed view 416 along line A-A. The heatsink 410 may be the heatsink 216 of FIG. 4. As illustrated in FIG. 22, the heatsink 410 may include a recessed portion 412 that may extend inwardly with respect to the surface at which the reflector component 210 is adjacent to. The recessed portion 412 is illustrated in detail in FIG. 24. The recessed portion 412 may form a cavity that may be sealed, and fluid sealed in the cavity, such as air, may pass through one or more passageways or openings 414 in the heatsink 410.

FIG. 23 illustrates an integrated heatsink and speaker assembly 420 in an exploded view, top view, and side view. As illustrated, the heatsink 410 may include the recessed portion 412. The recessed portion 412 may be recessed relative to an outer side 422 of the heatsink 410. The outer side 422 may be the side of the heatsink 410 adjacent to the reflector component 210. The recessed portion 412 may form a cavity in the heatsink 410. The recessed portion 412 (extending outwardly from the page) is visible in a top view 440 in the illustrated example.

A back plate 424 may be configured to seal the recessed portion 412, thereby sealing the cavity formed by the recessed portion 412. In some instances, air or other fluid may be sealed in the cavity when the back plate 424 is coupled to the heatsink 410. In some embodiments, the back plate 424 may be coupled to the heatsink 410 using an adhesive. The back plate 424 may be removable and may be optional. The cavity may be used to provide air and/or to otherwise facilitate sound output of certain frequencies using a speaker driver.

A speaker plate 426 may be coupled to the heatsink 410. The speaker plate 426 may be coupled to a first side of the heatsink 410, or a side opposite the outer side 422. The speaker plate 426 may be at least partially formed of plastic in one embodiment. The speaker plate 426 may be disposed within the heatsink 410 in some embodiments. Accordingly, the speaker plate 426 may have a diameter that is smaller than a diameter of the heatsink 410. For example, the heatsink 410 may have a first diameter, and the speaker assembly and/or speaker plate 426 may have a second diameter that is less than the first diameter. The speaker assembly and/or speaker plate 426 may be disposed within the heatsink 410.

A speaker 428 may be coupled to the speaker plate 426 to form a speaker assembly. The speaker 428 may be any suitable driver and may be configured to output sound. The speaker 428 may be oriented in an outward-facing direction relative to the heatsink 410 (e.g., the speaker 428 may face away from the heatsink 410, etc.). The speaker plate 426 may have a first wall 430 configured to receive a speaker, a second wall 432 transverse to the first wall 430, and a third wall 434 parallel to the first wall 430.

The speaker assembly may be coupled to the heatsink 410 using an adhesive, for example. The speaker plate 426 and the heatsink may together form or enclose a first sealed cavity. A sealed volume of fluid, such as air, may be sealed in the first sealed cavity after the speaker assembly and/or the speaker plate 426 and the heatsink 410 are coupled.

As illustrated in a side view 442, the heatsink 410 may include one or more cutout portions 444, which may be angled wall cutouts, where angled walls extend radially inward from an outer edge of the heatsink 410. The cutout portions 444 may include angled surfaces along an outer cylindrical surface of the heatsink 410 and/or extending inwardly from the outer cylindrical surface of the heatsink 410.

Figure 24:
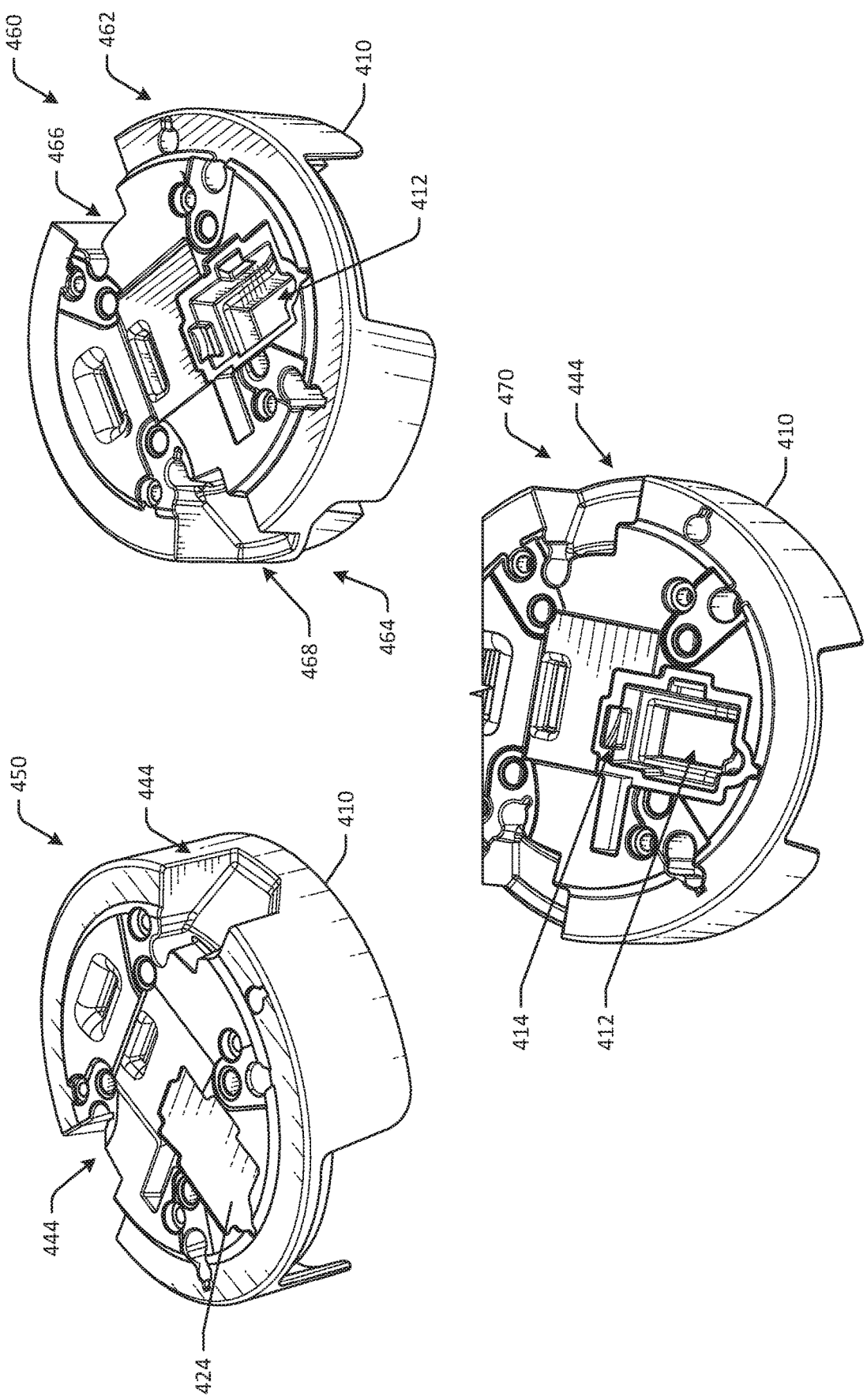

FIGS. 24-25 are schematic drawings of an integrated heatsink in various views in accordance with one or more embodiments of the disclosure. The integrated heatsink may be the heatsink 410 of FIG. 23. Other embodiments may include different components and/or different configurations. FIG. 25 illustrates the heatsink 410 with both an unsealed recessed portion 412 and a sealed recessed portion 412.

In FIG. 24, the heatsink 410 is illustrated in various perspective views with the cutout portions 444 and the back plate 424 in both a sealed position and an unsealed position. For example, in a first perspective view 450, the back plate 424 is in a sealed position. In a second perspective view 460, the back plate 424 is in an unsealed position and the recessed portion 412 is visible. In a third perspective view 470, the recessed portion 412 is also visible, along with opening 414 that may fluidically couple or connect the second sealed cavity formed by the recessed portion 412 with the first sealed cavity formed by the speaker plate 426 and the heatsink 410. In such embodiments, the air in the cavity formed by the recessed portion 412 may be used to increase the volume of air sealed in the device, as the first sealed cavity and the second sealed cavity may be in fluid communication. The recessed portion 412 may extend into the sealed volume of air, or the cavity that is created by the speaker plate 426 and the heatsink 410.

As illustrated in FIGS. 24-25, the heatsink 410 may have a cylindrical outer surface having a first portion 462 and a second portion 464. A first cutout portion 466 may be disposed along the first portion 462, where the first cutout portion 444 has a first angled wall extending inwardly, and a second cutout portion 468 along the second portion 464.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Device Architecture

Figure 26:
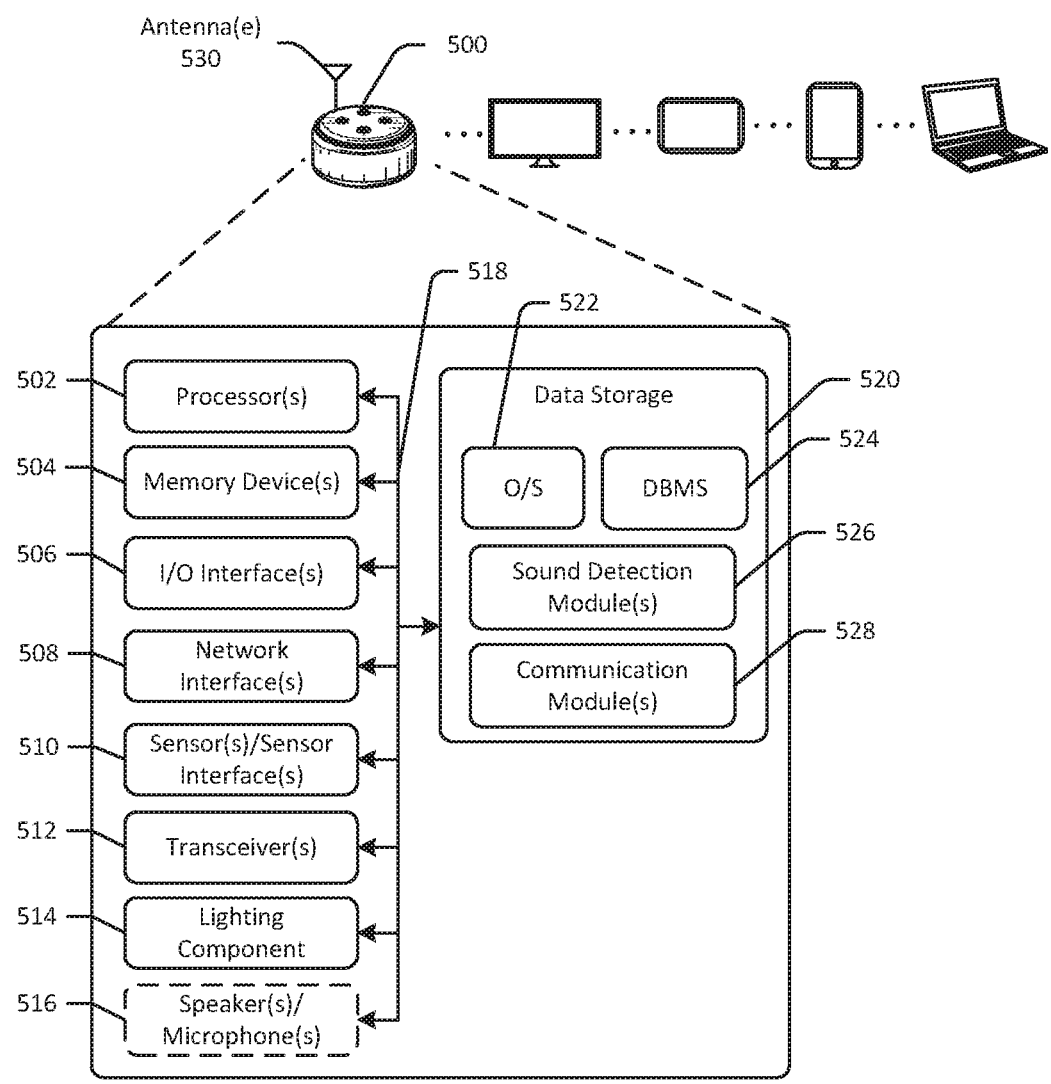
FIG. 26 schematically illustrates an example architecture of a voice activated device with integrated heatsink and speaker in accordance with one or more embodiments of the disclosure.

FIG. 26 is a schematic block diagram of one or more illustrative voice activated device(s) 500 in accordance with one or more example embodiments of the disclosure. The voice activated device(s) 500 may include any suitable computing device with a light bar component with or without a display, in some instances, including, but not limited to, a server system, a mobile device such as a smartphone, a tablet, an e-reader, a wearable device, or the like; a desktop computer; a laptop computer; a content streaming device; a set-top box; a scanning device; a speaker device; or the like. The voice activated device(s) 500 may correspond to an illustrative device configuration for the scanning device of FIGS. 1-25.

The voice activated device(s) 500 may be configured to communicate with one or more servers, user devices, or the like. The voice activated device(s) 500 may be configured to determine voice commands, determine wakeword utterances, determine and/or control other devices, and other operations. The voice activated device(s) 500 may be configured to emit light, detect sound, output digital content, and other functionality. In some embodiments, a single remote server or a single group of remote servers may be configured to perform more than one type of functionality in conjunction with a barcode scanning device.

The voice activated device(s) 500 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the voice activated device(s) 500 may include one or more processors (processor(s)) 502, one or more memory devices 504 (also referred to herein as memory 504), one or more input/output (I/O) interface(s) 506, one or more network interface(s) 508, one or more sensor(s) or sensor interface(s) 510, one or more transceiver(s) 512, one or more lighting components 514, and one or more optional camera(s)/microphone(s) 516, and data storage 520. The voice activated device(s) 500 may further include one or more bus(es) 518 that functionally couple various components of the voice activated device(s) 500. The voice activated device(s) 500 may further include one or more antenna(e) 530 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 518 may include at least one of a system bus, a memory bus, an address bus, or a message bus, and may permit the exchange of information (e.g., data (including computer-executable code), signaling, etc.) between various components of the voice activated device(s) 500. The bus(es) 518 may include, without limitation, a memory bus or a memory controller, a peripheral bus, an accelerated graphics port, and so forth. The bus(es) 518 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 504 of the voice activated device(s) 500 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 504 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 504 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 520 may include removable storage and/or non-removable storage including, but not limited to, magnetic storage, optical disk storage, and/or tape storage. The data storage 520 may provide non-volatile storage of computer-executable instructions and other data. The memory 504 and the data storage 520, removable and/or non-removable, are examples of computer-readable storage media (CRSM) as that term is used herein.

The data storage 520 may store computer-executable code, instructions, or the like that may be loadable into the memory 504 and executable by the processor(s) 502 to cause the processor(s) 502 to perform or initiate various operations. The data storage 520 may additionally store data that may be copied to the memory 504 for use by the processor(s) 502 during the execution of the computer-executable instructions. Moreover, output data generated as a result of execution of the computer-executable instructions by the processor(s) 502 may be stored initially in the memory 504, and may ultimately be copied to the data storage 520 for non-volatile storage.

More specifically, the data storage 520 may store one or more operating systems (O/S) 522; one or more database management systems (DBMS) 524; and one or more program module(s), applications, engines, computer-executable code, scripts, or the like such as, for example, one or more sound detection module(s) 526 and/or one or more communication module(s) 528. Some or all of these module(s) may be sub-module(s). Any of the components depicted as being stored in the data storage 520 may include any combination of software, firmware, and/or hardware. The software and/or firmware may include computer-executable code, instructions, or the like that may be loaded into the memory 504 for execution by one or more of the processor(s) 502. Any of the components depicted as being stored in the data storage 520 may support functionality described in reference to corresponding components named earlier in this disclosure.

The data storage 520 may further store various types of data utilized by the components of the voice activated device(s) 500. Any data stored in the data storage 520 may be loaded into the memory 504 for use by the processor(s) 502 in executing computer-executable code. In addition, any data depicted as being stored in the data storage 520 may potentially be stored in one or more datastore(s) and may be accessed via the DBMS 524 and loaded in the memory 504 for use by the processor(s) 502 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 26, an example datastore(s) may include, for example, historical data for previously identified utterances, speaker identification or profile information, and/or other information.

The processor(s) 502 may be configured to access the memory 504 and execute the computer-executable instructions loaded therein. For example, the processor(s) 502 may be configured to execute the computer-executable instructions of the various program module(s), applications, engines, or the like of the voice activated device(s) 500 to cause or facilitate various operations to be performed in accordance with one or more embodiments of the disclosure. The processor(s) 502 may include any suitable processing unit capable of accepting data as input, processing the input data in accordance with stored computer-executable instructions, and generating output data. The processor(s) 502 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 502 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 502 may be capable of supporting any of a variety of instruction sets.

Referring now to functionality supported by the various program module(s) depicted in FIG. 26, the sound detection module(s) 526 may include computer-executable instructions, code, or the like that responsive to execution by one or more of the processor(s) 502 may perform functions including, but not limited to, detect sound, determine sound meanings, generate audio signals and audio data, determine a location of sound, determining a light bar illumination status, determining which LEDs to illuminate, causing a change in illumination status, and the like.

The communication module(s) 528 may include computer-executable instructions, code, or the like that responsive to execution by one or more of the processor(s) 502 may perform functions including, but not limited to, sending and/or receiving data, including content, sending and/or receiving instructions and commands, and the like.

Referring now to other illustrative components depicted as being stored in the data storage 520, the O/S 522 may be loaded from the data storage 520 into the memory 504 and may provide an interface between other application software executing on the voice activated device(s) 500 and the hardware resources of the voice activated device(s) 500. More specifically, the O/S 522 may include a set of computer-executable instructions for managing the hardware resources of the voice activated device(s) 500 and for providing common services to other application programs (e.g., managing memory allocation among various application programs). In certain example embodiments, the O/S 522 may control execution of the other program module(s). The O/S 522 may include any operating system now known or which may be developed in the future including, but not limited to, any server operating system, any mainframe operating system, or any other proprietary or non-proprietary operating system.

The DBMS 524 may be loaded into the memory 504 and may support functionality for accessing, retrieving, storing, and/or manipulating data stored in the memory 504 and/or data stored in the data storage 520. The DBMS 524 may use any of a variety of database models (e.g., relational model, object model, etc.) and may support any of a variety of query languages. The DBMS 524 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the voice activated device(s) 500 is a mobile device, the DBMS 524 may be any suitable lightweight DBMS optimized for performance on a mobile device.

Referring now to other illustrative components of the voice activated device(s) 500, the input/output (I/O) interface(s) 506 may facilitate the receipt of input information by the voice activated device(s) 500 from one or more I/O devices as well as the output of information from the voice activated device(s) 500 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the voice activated device(s) 500 or may be separate. The I/O devices may further include, for example, any number of peripheral devices such as data storage devices, printing devices, and so forth.

The I/O interface(s) 506 may also include an interface for an external peripheral device connection such as universal serial bus (USB), FireWire, Thunderbolt, Ethernet port or other connection protocol that may connect to one or more networks. The I/O interface(s) 506 may also include a connection to one or more of the antenna(e) 530 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The voice activated device(s) 500 may further include one or more network interface(s) 508 via which the voice activated device(s) 500 may communicate with any of a variety of other systems, platforms, networks, devices, and so forth. The network interface(s) 508 may enable communication, for example, with one or more wireless routers, one or more host servers, one or more web servers, and the like via one or more networks.

The antenna(e) 530 may include any suitable type of antenna depending, for example, on the communications protocols used to transmit or receive signals via the antenna (e) 530. Non-limiting examples of suitable antennae may include directional antennae, non-directional antennae, dipole antennae, folded dipole antennae, patch antennae, multiple-input multiple-output (MIMO) antennae, or the like. The antenna(e) 530 may be communicatively coupled to one or more transceivers 512 or radio components to which or from which signals may be transmitted or received.

As previously described, the antenna(e) 530 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 530 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 530 may be configured to transmit or receive radio frequency signals within any suitable frequency range forming part of the unlicensed portion of the radio spectrum.

The antenna(e) 530 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 512 may include any suitable radio component(s) for—in cooperation with the antenna(e) 530—transmitting or receiving radio frequency (RF) signals in the bandwidth and/or channels corresponding to the communications protocols utilized by the voice activated device(s) 500 to communicate with other devices. The transceiver(s) 512 may include hardware, software, and/or firmware for modulating, transmitting, or receiving—potentially in cooperation with any of antenna(e) 530—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 512 may further include hardware, firmware, or software for receiving GNSS signals. The transceiver(s) 512 may include any known receiver and baseband suitable for communicating via the communications protocols utilized by the voice activated device(s) 500. The transceiver(s) 512 may further include a low noise amplifier (LNA), additional signal amplifiers, an analog-to-digital (A/D) converter, one or more buffers, a digital baseband, or the like.

The sensor(s)/sensor interface(s) 510 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The lighting element(s) 514 may include one or more LEDs that may be illuminated responsive to detected sound and may be in a circular or substantially circular configuration. The optional camera(s) 516 may be any device configured to capture ambient light or images. The optional microphone(s) 516 may be any device configured to receive analog sound input or voice data.

It should be appreciated that the program module(s), applications, computer-executable instructions, code, or the like depicted in FIG. 26 as being stored in the data storage 520 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the voice activated device(s) 500, and/or hosted on other computing device(s) accessible via one or more networks, may be provided to support functionality provided by the program module(s), applications, or computer-executable code depicted in FIG. 26 and/or additional or alternate functionality. Further, functionality may be modularized differently such that processing described as being supported collectively by the collection of program module(s) depicted in FIG. 26 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 26 may be implemented, at least partially, in hardware and/or firmware across any number of devices.

It should further be appreciated that the voice activated device(s) 500 may include alternate and/or additional hardware, software, or firmware components beyond those described or depicted without departing from the scope of the disclosure. More particularly, it should be appreciated that software, firmware, or hardware components depicted as forming part of the voice activated device(s) 500 are merely illustrative and that some components may not be present or additional components may be provided in various embodiments. While various illustrative program module(s) have been depicted and described as software module(s) stored in the data storage 520, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-25 may be performed by a device having the illustrative configuration depicted in FIG. 26, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-25 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-25 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms.

The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A voice activated device comprising: a cylindrical housing; a first light emitting diode (LED) configured to emit light, the first LED positioned within the cylindrical housing; a circular light ring disposed about an upper portion of the cylindrical housing, wherein the light is visible through the circular light ring; an integrated speaker and heatsink assembly comprising: an aluminum heatsink; and a speaker subassembly coupled to a first side of the aluminum heatsink, the speaker subassembly comprising a speaker plate coupled to an outward-facing speaker, wherein the aluminum heatsink and the speaker subassembly together enclose a sealed cavity; and a circular light reflector disposed adjacent to a second side of the aluminum heatsink, wherein the circular light reflector comprises: a plurality of substantially linear members extending radially inwards relative to a circular perimeter of the circular light reflector; and a first light diffuser element comprising a triangular member oriented radially inwards relative to the circular perimeter and aligned with the first LED.

2. The voice activated device of claim 1, wherein the aluminum heatsink comprises: a recessed portion disposed on the second side, wherein the sealed cavity has a first thickness between the recessed portion and the speaker subassembly that is less than a second thickness between the second side and the speaker subassembly; and a removable back plate coupled to the second side and configured to seal an opening formed on the second side by the recessed portion.

3. The voice activated device of claim 1, further comprising a second LED and a second light diffuser element, and wherein the circular light reflector further comprises: a first substantially flat portion disposed between the triangular member and the first LED, the first substantially flat portion having a center that is aligned with the first LED and the triangular member; a second substantially flat portion disposed between the second light diffuser element and the second LED, the second substantially flat portion having a center that is aligned with the second LED; a first curved portion extending from the first substantially flat portion outward toward the circular perimeter; and a second curved portion extending from the second substantially flat portion outward toward the circular perimeter, wherein a first end of the first curved portion and a second end of the second curved portion merge at a midpoint between the first LED and the second LED.

4. A voice activated device comprising: a light ring; a first LED; a heatsink comprising a first side and a second side; a speaker assembly coupled to the first side of the heatsink assembly, wherein the heatsink and the speaker assembly together form a first sealed cavity; and a reflector component disposed adjacent to the second side and configured to direct light towards the light ring, wherein the reflector component comprises a linear member and a bent member.

5. The voice activated device of claim 4, wherein the heatsink further comprises: a recessed portion disposed on the second side; and a back plate configured to seal the recessed portion and form a second sealed cavity, wherein the second sealed cavity is in fluid communication with the first sealed cavity.

6. The voice activated device of claim 4, wherein the heatsink further comprises: a cylindrical outer surface comprising a first portion and a second portion; a first cutout portion along the first portion, wherein the first cutout portion comprises a first angled wall extending inwardly relative to the cylindrical outer surface; and a second cutout portion along the second portion, wherein the second cutout portion comprises a second angled wall extending inwardly relative to the cylindrical outer surface.

7. The voice activated device of claim 4, wherein the reflector component further comprises: a raised triangular portion comprising a tip and a base, wherein the tip is substantially aligned with the first LED; and a raised rectangular portion disposed between the base and a perimeter of the reflector component.

8. The voice activated device of claim 7, wherein the raised triangular portion has a first height at the tip and a second height at the base, and wherein the first height is less than the second height.

9. The voice activated device of claim 4, further comprising a second LED, wherein the reflector component further comprises: a first substantially flat portion having a center that is aligned with the first LED; a second substantially flat portion having a center that is aligned with the second LED; a first curved portion extending from the first substantially flat portion outward toward a perimeter of the reflector component; and a second curved portion extending from the second substantially flat portion outward toward the perimeter, wherein a first end of the first curved portion and a second end of the second curved portion merge between the first LED and the second LED.

10. The voice activated device of claim 9, wherein the reflector component further comprises: a raised triangular portion comprising a tip and a base, wherein the tip is substantially aligned with the center.

11. The voice activated device of claim 4, wherein the heatsink has a first diameter, and the speaker assembly has a second diameter that is less than the first diameter, and wherein the speaker assembly is disposed within the heatsink.

12. The voice activated device of claim 4, wherein the heatsink comprises metal and the speaker assembly comprises a speaker that is coupled to a plastic speaker plate.

13. The voice activated device of claim 4, wherein the reflector component is circular and is disposed adjacent to an inner portion of the light ring, and wherein the reflector component further comprises: a bent member oriented radially inwards relative to a circular perimeter of the reflector component, the bent member comprising a first portion oriented towards a center of the reflector component, and a second portion oriented towards the circular perimeter.

14. The voice activated device of claim 4, wherein the reflector component comprises a first substantially linear member that is oriented towards a center of the reflector component, and a bent member comprising a first portion that is oriented towards the center and a second portion that is oriented away from the center.

15. A voice activated device comprising: a microphone; a speaker; a housing having a top portion and a bottom portion; a light ring component disposed along an outer surface of the device; a plurality of LEDs positioned within the housing; an integrated metal heatsink and plastic speaker assembly; and a reflector comprising a raised diffuser portion aligned with a first LED of the plurality of LEDs.

16. The device of claim 15, wherein the raised diffuser portion comprises a raised triangular portion having a tip and a base, and wherein the tip is substantially aligned with the first LED.

17. The device of claim 15, wherein the raised diffuser portion has a first height at a radially inward location and a second height at a radially outward position, and wherein the first height is less than the second height.

18. The device of claim 15, wherein the reflector comprises a first side that is flat and a second side at which the raised diffuser portion is disposed.

19. The device of claim 15, wherein the reflector is circular and is disposed adjacent to an inner portion of the light ring, and wherein the reflector component further comprises: a bent member oriented radially inwards relative to a circular perimeter of the reflector component, the bent member comprising a first portion oriented towards a center of the reflector component, and a second portion oriented towards the circular perimeter.

20. The device of claim 15, wherein the integrated metal heatsink has a first diameter, and the plastic speaker assembly has a second diameter that is less than the first diameter.

* * * * *